United States Patent [19]

Urano et al.

[11] Patent Number: 5,558,971
[45] Date of Patent: Sep. 24, 1996

[54] RESIST MATERIAL

[75] Inventors: Fumiyoshi Urano; Takaai Negishi, both of Kawagoe; Akiko Katsuyama, Moriguchi; Masayuki Endo, Izumi, all of Japan

[73] Assignees: Wako Pure Chemical Industries, Ltd.; Matsushita Electric Industrial Co., Ltd., both of Osaka, Japan

[21] Appl. No.: 407,611

[22] Filed: Mar. 21, 1995

[30] Foreign Application Priority Data

Sep. 2, 1994 [JP] Japan .................................. 6-234246

[51] Int. Cl.$^6$ .............................. G03F 7/004; G03F 7/30
[52] U.S. Cl. ...................... 430/170; 430/189; 430/270.1; 430/326; 430/330; 430/909; 522/65; 522/67; 522/68
[58] Field of Search ...................................... 430/170, 270, 430/189, 909, 326, 330; 522/65, 67, 68

[56] References Cited

U.S. PATENT DOCUMENTS

| | | | |
|---|---|---|---|
| 5,332,650 | 7/1994 | Murata et al. | 430/270 |
| 5,338,641 | 8/1994 | Pawlowski et al. | 430/270 |
| 5,340,682 | 8/1994 | Pawlowski et al. | 430/189 |
| 5,350,660 | 9/1994 | Urano et al. | 430/270 |

FOREIGN PATENT DOCUMENTS

| | | |
|---|---|---|
| 0447868A1 | 9/1991 | European Pat. Off. . |
| 0520642 | 12/1992 | European Pat. Off. . |
| 0588544 | 3/1994 | European Pat. Off. . |
| 41 11 060A1 | 4/1990 | Germany . |

OTHER PUBLICATIONS

Derwent Publications Ltd., Class A89, AN 94–223190 & JP–A 06 161 112 Apr. 7, 1994.

*Primary Examiner*—John S. Y. Chu
*Attorney, Agent, or Firm*—Armstrong, Westerman, Hattori, McLeland & Naughton

[57] ABSTRACT

A resist material comprising (a) a terpolymer, (b) a photo-acid generator, and (c) a solvent has high light sensitivity, heat resistance, adhesiveness, resolution, etc., and is suitable for forming a pattern of rectangular shape.

7 Claims, 5 Drawing Sheets

RESIST MATERIAL

BACKGROUND OF THE INVENTION

The present invention relates to a resist material used in the production of semiconductor devices and a pattern forming method using such a resist material. More particularly, the invention pertains to a resist material used for forming positive patterns with ultraviolet light, especially deep ultraviolet light with a wavelength of 300 nm or less, for example, KrF excimer laser light used as exposure energy source.

With a recent trend toward high-density integration of semiconductor devices, there has been rising call for shortening of wavelength of the energy source of exposure means used for fine working, particularly photolithography, and now use of deep ultraviolet light (300 nm or less) and KrF excimer laser light (248.4 nm) is seriously considered. However, there has yet been available no high-utility resist material suited for working with light with said range of wavelength.

Dissolution-inhibiting type resist materials comprising a polymer with high permeability to light with a wavelength of around 248.4 nm and a photosensitive compound having a diazodiketo group in the molecule have been developed as resist material for pattern formation using KrF excimer laser light or deep ultraviolet light as light source (Japanese Patent Application Kokai (Laid-Open) No. (JP-A-) 1-80944; JP-A-1-154048; JP-A-1-155338; JP-A-1-155339; JP-A-1-188852; Y. Tani et at: Proc. SPIE, 1086, 22 (1989), etc.). These dissolution-inhibiting type resist materials, however, are all low in sensitivity and unusable for applications involving use of deep ultraviolet light or KrF excimer laser light where a high-sensitivity resist material is required. Recently, as means for reducing the amount of energy required for exposure (means for elevating sensitivity), use of a chemically amplified resist material with an exposure-generated acid applied as medium has been proposed [H. Ito et al: Polym. Eng. Sci., 23, 1012 (1983)], and many reports on this type of resist material have been made public (U.S. Pat. No. 4,491,628 (1985) to H. Ito et al; JP-A-2-27660; U.S. Pat. No. 4,603,101 (1986) to J. C. Crivello et al; JP-A-62-115440; W. R. Brunsvolt et al: Proc. SPIE, 1086, 357 (1989); T. X. Neenan et al: Proc. SPIE, 1086, 2 (1989); R. G. Tarascon et al: SPE Regional Conference Technical Papers, Ellenville, N.Y., p. 11, 1988; JP-A-2-25850; Y. Jian et al: Polym. Mater. Sci. & Eng., 26, 41 (1992), etc.). These known chemically amplified resist materials, however, also have varied problems in practical use depending on the type of the polymer used. For example, in case of using phenol ether type polymers such as poly(p-tert-butoxycarbonyloxystyrene), poly(p-tert-butoxystyrene), poly(p-tert-butoxycarbonyloxy-α-methylstyrene), poly(p-tert-butoxy-α-methylstyrene), poly(tert-butyl p-isopropenylphenoxyacetate), poly(p-tert-butoxycarbonyloxystyrene/sulfone), poly(p-tetrahydropyranyloxystyrene), poly {p-(1-methoxyethoxy)styrene}, poly {p-(1-phenoxyethoxy)styrene} or the like, the produced resist material tends to cause film separation during development due to poor adhesion to the substrate, and such resist material also proves poor in heat resistance, making it unable to obtain a good pattern. In case of using a carboxylic acid type polymer such as poly(tert-butyl p-vinylbenzoate) or poly(tetrahydropyranyl p-vinylbenzoate), the produced resist material is found unsatisfactory in permeability to light with a wavelength around 248.4 nm due to the presence of benzoyl group and therefore has poor resolution. In the case of poly(tert-butyl methacrylate), there are the problems of unsatisfactory heat resistance, poor dry etch resistance.

Resist materials using silicon-containing polymers have also been disclosed (JP-B-3-44290, etc.), but use of such silicon-containing polymers, for instance, poly(p-trimethylsilyloxystyrene) or poly(p-tert-butyldimethylsilyloxystyrene), is encounted with the problems such as low sensitivity and impossibility to perfectly remove the resist material by ashing as it contains silicon. Thus, these resist materials are hardly capable of practical use.

More recently, as the chemically amplified resist materials freed of the defects mentioned above, there have been reported a resist material using poly(p-tert-butoxycarbonyloxystyrene/p-hydroxystyrene) (JP-A-2-209977; JP-A-3-206458), a resist material using poly(p-tetrahydropyranyloxystyrene/p-hydroxystyrene) (JP-A-2-19847; JP-A-2-161436; JP-A-3-83063) and a resist material using poly(p-tert-butoxystyrene/p-hydroxystyrene) [JP-A-2-62544; JP-A-4-211258 (U.S. Pat. No. 5,350,660)]. The resist materials using these polymers, however, involve the problem of delay time (the problem of change of pattern size or deformation during the period from resist coating till exposure or from exposure till heat treatment (PEB)) which is hotly discussed recently in practical application of resist materials.

Further, resist materials using the polymers having an acetal group or ketal group introduced as protective group have also been reported (JP-A-2-19847; JP-A-2-161436; JP-A-4-219757; JP-A-5-281745; JP-A-5-249682). However, the resist materials using these polymers, for example, poly(p-1-ethoxyethoxystyrene/p-hydroxystyrene), poly(p-1-methoxyethoxystyrene/p-hydroxystyrene), poly(p-1-methoxy-1-methylethoxystyrene/p-hydroxystyrene), poly(p-1-ethoxyethoxystyrene/p-hydroxystyrene/methyl methacrylate) and poly(p-1-ethoxyethoxystyrene/p-hydroxystyrene/fumaronitrile) have the problems of poor storage stability, great deterioration of pattern size and shape on defocuing and small focus margin, so that it is difficult to form resist patterns with consistent stability by using these resist materials. They also involve the problems of formation of scums (non-dissolved portion at the time of development) and poor mask linearity. JP-A-3-282550 discloses a resist material comprising poly(1-methoxy-1-methylethoxystyrene/p-hydroxystyrene) and diphenyliodium salt, but this resist material has the problems of poor adhesiveness to the substrate and delay time in addition to the problems mentioned above. Resist materials using the polymers according to the present invention, for example, poly(p-1-ethoxyethoxystyrene/p-hydroxystyrene/p-tert-butoxystyrene) have also been reported (JP-A-6-194842). These resist materials, however, are all designed for use with electron rays, and if they are exposed to ultraviolet light, such as KrF excimer laser light, there arise such problems as imperfect resolution of the bottom portion (footing) of the pattern and formation of scums and consequent transfer of such scums to the pattern during etching.

As viewed above, the chemically amplified resist materials, although high in sensitivity as compared with the conventional resist materials, still have difficult problems such as poor heat resistance of polymers used therefor, imperfect adhesion to the substrate, insufficient transmittance to light with a wavelength around 24.8.4 nm, unsatisfactory resolving performance, change of pattern size or deterioration of pattern shape with time, poor storage stability, insufficient focus margin, unsatisfactory mask linearity, footing of the pattern and formation of scums, which discourage practical application of these resist materials. Thus, the appearance of a practical high-sensitivity resist material freed of the above-said problems has been desired.

SUMMARY OF THE INVENTION

The present invention has been made in view of the above circumstances and it has for its object to provide a practical resist material which has high transmittance to ultraviolet light, especially deep ultraviolet light with a wavelength of 300 nm or less such as KrF excimer laser light, has high sensitivity to exposure to these light sources or irradiation with electron beam or soft X-rays, has excellent heat resistance and adhesiveness to the substrate, has high resolution, won't cause change of pattern size with time to allow formation of a pattern with high accuracy, has excellent storage stability, has a broad focus margin and good mask linearity, and is capable of forming a pattern of rectangular shape without causing footing of the pattern or formation of scums, and a pattern forming process using such a resist material.

The present invention provides a resist material comprising:

(a) a polymer represented by the formula [1]:

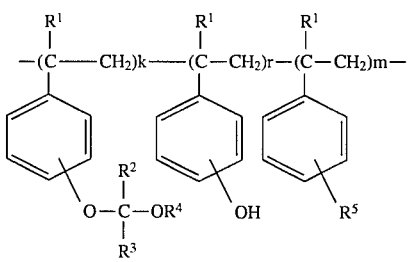

wherein $R^1$ is a hydrogen atom or a methyl group; $R^2$ and $R^3$ are independently a hydrogen atom, a straight-chain, branched or cyclic alkyl group having 1–6 carbon atoms, a straight-chain or branched haloalkyl group having 1–6 carbon atoms or a phenyl group, provided that $R^2$ and $R^3$ are not hydrogen atom at the same time, or $R^2$ and $R^3$ may combine to form a methylene chain having 2–5 carbon atoms; $R^4$ is a straight-chain, branched or cyclic alkyl group having 1–10 carbon atoms, a straight-chain, branched or cyclic haloalkyl group having 1–6 carbon atoms, an acetyl group or an aralkyl group; $R^5$ is a hydrogen atom, a straight-chain, branched or cyclic alkyl group having 1–6 carbon atoms, a straight-chain, branched or cyclic alkoxy group having 1–6 carbon atoms, a tetrahydropyranyloxy group, a tetrahydrofuranyloxy group, a tert-butoxycarbonyloxy group, a tert-butoxycarbonylmethoxy group or an acetyloxy group; and k, r and m are independently an integer of 1 or more, provided that $0.10 \leq (k+m)/(k+r+m) \leq 0.90$ and $0.01 \leq m/(k+r+m) \leq 0.25$;

(b) at least one photosensitive compound capable of generating an acid upon exposure to light, selected from the group consisting of the photosensitive compounds represented by the following formula [2], the photosensitive compounds represented by the formula [3], the photosensitive compounds represented by the formula [5], the photosensitive compounds represented by the formula [6], the photosensitive compounds represented by the formula [9] and the photosensitive compounds represented by the formula [12]:

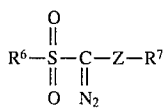

wherein $R^6$ and $R^7$ are independently a straight-chain, branched or cyclic alkyl group having 1–10 carbon atoms; and Z is a sulfonyl group or a carbonyl group;

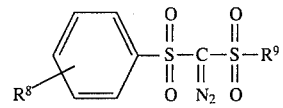

wherein $R^8$ is a hydrogen atom, a halogen atom, a straight-chain or branched alkyl group having 1–5 carbon atoms, a straight-chain or branched alkoxy group having 1–5 carbon atoms, or a straight-chain or branched haloalkyl group having 1–5 carbon atoms; and $R^9$ is a straight-chain, branched or cyclic alkyl group having 1–10 carbon atoms, a haloalkyl group having 1–10 carbon atoms, or a group represented by the formula [4]:

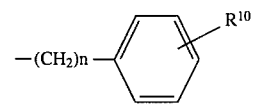

wherein $R^{10}$ is a hydrogen atom, a halogen atom, a straight-chain or branched alkyl group having 1–5 carbon atoms, a straight-chain or branched alkoxy group having 1–5 carbon atoms, or a straight-chain or branched haloalkyl group having 1–5 carbon atoms; and n is 0 or an integer of 1–3;

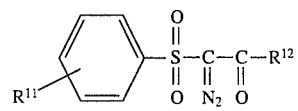

wherein $R^{11}$ is a hydrogen atom, a halogen atom, a straight-chain or branched alkyl group having 1–5 carbon atoms, an aralkyl group or a trifluoromethyl group; $R^{12}$ is a straight-chain, branched or cyclic alkyl group having 1–10 carbon atoms, an aralkyl group, a straight-chain or branched alkoxy group having 1–5 carbon atoms, a phenyl group or a tolyl group;

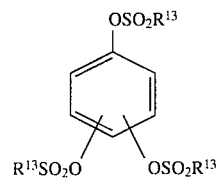

wherein $R^{13}$ is a group represented by the formula [7]:

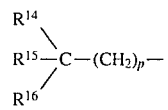

wherein $R^{14}$, $R^{15}$ and $R^{16}$ are independently a hydrogen atom or a halogen atom; and p is 0 or an integer of 1–3, or a group represented by the formula [8]:

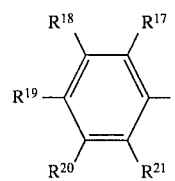

wherein $R^{17}$, $R^{18}$, $R^{19}$, $R^{20}$ and $R^{21}$ are independently a hydrogen atom, a halogen atom, a straight-chain or branched alkyl group having 1–5 carbon atoms, a straight-chain or branched alkoxy group having 1–5 carbon atoms, a trifluoromethyl group, a hydroxyl group, a trifluoromethoxy group or a nitro group;

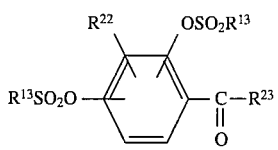

wherein $R^{13}$ is as defined above; $R^{22}$ is a hydrogen atom, a hydroxyl group or a group represented by the formula [10]:

wherein $R^{13}$ is as defined above; and $R^{23}$ is a straight-chain or branched alkyl group having 1–5 carbon atoms or a group represented by the formula [11]:

wherein $R^{24}$ and $R^{30}$ are independently a hydrogen atom, a halogen atom, a straight-chain or branched alkyl group having 1–5 carbon atoms, a straight-chain or branched alkoxy group having 1–5 carbon atoms, or a group of the formula [10];

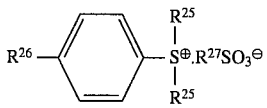

wherein $R^{25}$ is a straight-chain or branched alkyl group having 1–4 carbon atoms, a phenyl group, a substituted phenyl group or an aralkyl group; $R^{26}$ is a hydrogen atom, a halogen atom or a straight-chain, branched or cyclic alkyl group having 1–6 carbon atoms; $R^{27}$ is a straight-chain or branched perfluoroalkyl group having 1–8 carbon atoms, a straight-chain, branched or cyclic alkyl group having 1–8 carbon atoms, a 1-naphthyl group, a 2-naphthyl group, a 10-camphor group, a phenyl group, a tolyl group, a 2,5-dichlorophenyl group, a 1,3,4-trichlorophenyl group or a trifluoromethylphenyl group; and (c) a solvent capable of dissolving the above substances.

The present invention also provides a pattern forming process comprising the steps of coating the resist material described above on a substrate; heating and exposing the coating film to light of 300 nm or less through a mask; heating the exposed coating film if necessary; and developing the film with a developing solution.

DESCRIPTION OF THE PREFERRED EMBODIMENTS

Figure 1A:
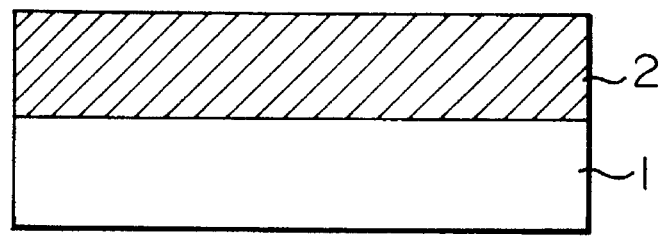
FIG. 1A–1C are the sectional views illustrating the process for forming a positive pattern using a resist material according to the present invention.

The resist material according to the present invention comprises:

(a) a polymer represented by the formula [1]:

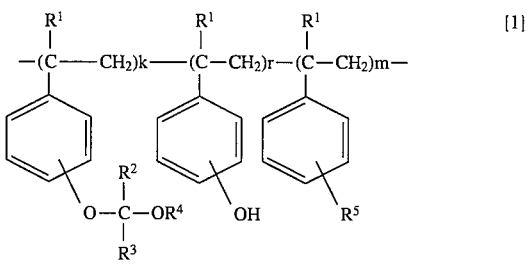

wherein $R^1$ is a hydrogen atom or a methyl group; $R^2$ and $R^3$ are independently a hydrogen atom, a straight-chain, branched or cyclic alkyl group having 1–6 carbon atoms, a straight-chain or branched haloalkyl group having 1–6 carbon atoms, or a phenyl group, provided that $R^2$ and $R^3$ are not hydrogen atom at the same time, or $R^2$ and $R^3$ may combine to form a methylene chain having 2–5 carbon atoms; $R^4$ is a straight-chain, branched or cyclic alkyl group having 1–10 carbon atoms, a straight-chain, branched or cyclic haloalkyl group having 1–6 carbon atoms, an acetyl group or an aralkyl group; $R^5$ is a hydrogen atom, a halogen atom, a straight-chain, branched or cyclic alkyl group having 1–6 carbon atoms, a straight-chain, branched or cyclic alkoxy group having 1–6 carbon atoms, a tetrahydroxypyranyloxy group, a tetrahydrofuranyloxy group, a tert-butoxycarbonyloxy group, a tert-butoxycarbonylmethoxy group or an acetyloxy group; and k, r and m are independently an integer of 1 or more, provided that $0.10 \leq (k+m)/(k+r+m) \leq 0.90$ and $0.01 \leq m/(k+r+m) \leq 0.25$;

(b) at least one photosensitive compound capable of generating an acid upon exposure to light, selected from the group consisting of the photosensitive compounds represented by the following formulae [2], [3], [5], [6], [9] and [12]:

wherein $R^6$ and $R^7$ are independently a straight-chain, branched or cyclic alkyl group having 1–10 carbon atoms or a haloalkyl group having 1–10 carbon atoms; and Z is a sulfonyl group or a carbonyl group;

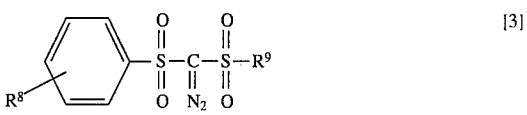

wherein $R^8$ is a hydrogen atom, a halogen atom, a straight-chain or branched alkyl group having 1–5 carbon atoms, a straight-chain or branched alkoxy group having 1–5 carbon atoms or a straight-chain or branched haloalkyl group having 1–5 carbon atoms; and $R^9$ is a straight-chain, branched or cyclic alkyl group having 1–10 carbon atoms, a haloalkyl group having 1–10 carbon atoms or a group represented by the formula [4]:

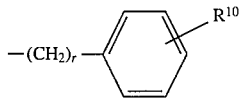 [4]

wherein $R^{10}$ is a hydrogen atom, a halogen atom, a straight-chain or branched alkyl group having 1–5 carbon atoms, a straight-chain or branched alkoxy group having 1–5 carbon atoms or a straight-chain or branched haloalkyl group having 1–5 carbon atoms; and n is 0 or an integer of 1–3;

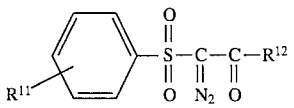 [5]

wherein $R^{11}$ is a hydrogen atom, a halogen atom, a straight-chain or branched alkyl group having 1–5 carbon atoms, an aralkyl group or a trifluoromethyl group; and $R^{12}$ is a straight-chain, branched or cyclic alkyl group having 1–10 carbon atoms, an aralkyl group, a straight-chain or branched alkoxy group having 1–5 carbon atoms, a phenyl group or a tolyl group;

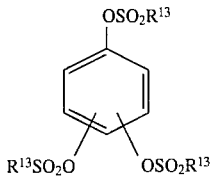 [6]

wherein $R^{13}$ is a group represented by the formula [7]:

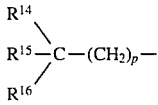 [7]

wherein $R^{14}$, $R^{15}$ and $R^{16}$ are independently a hydrogen atom or a halogen atom; and p is 0 or an integer of 1–3, or a group represented by the formula [8]:

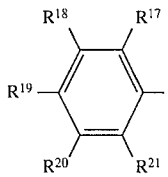 [8]

wherein $R^{17}$, $R^{18}$, $R^{19}$, $R^{20}$ and $R^{21}$ are independently a hydrogen atom, a halogen atom, a straight-chain or branched alkyl group having 1–5 carbon atoms, a straight-chain or branched alkoxy group having 1–5 carbon atoms, a trifluoromethyl group, a hydroxyl group, a trifluoromethoxy group or a nitro group;

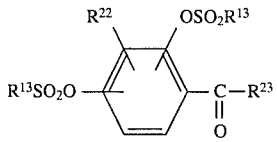 [9]

wherein $R^{13}$ is as defined above, $R^{22}$ is a hydrogen atom, a hydroxyl group or a group represented by the formula [10]:

$R^{13}SO_2-$ [10]

wherein $R^{13}$ is as defined above; and $R^{23}$ is a straight-chain or branched alkyl group having 1–5 carbon atoms or a group represented by the formula [11]:

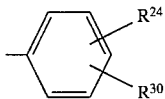 [11]

wherein $R^{24}$ and $R^{25}$ are independently a hydrogen atom, a halogen atom, a straight-chain or branched alkyl group having 1–5 carbon atoms, a straight-chain or branched alkoxy group having 1–5 carbon atoms or a group of the formula [10];

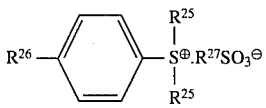 [12]

wherein $R^{25}$ is a straight-chain or branched alkyl group having 1–4 carbon atoms, a phenyl group, a substituted phenyl group or an aralkyl group; $R^{26}$ is a hydrogen atom, a halogen atom or a straight-chain, branched or cyclic alkyl group having 1–6 carbon atoms; and $R^{27}$ is a straight-chain or branched perfluoroalkyl group having 1–8 carbon atoms, a straight-chain, branched or cyclic alkyl group having 1–8 carbon atoms, a 1-naphthyl group, a 2-naphthyl group, a 10-camphor group, a phenyl group, a tolyl group, a 2,5-dichlorophenyl group, a 1,3,4-trichlorophenyl group or a trifluoromethylphenyl group; and (c) a solvent capable of dissolving the above substances.

The $C_{1-6}$ alkyl groups represented by $R^2$, $R^3$ and $R^5$ in the formula [1] and the alkyl group in the $C_{1-6}$ haloalkyl groups represented by $R^2$, $R^3$ and $R^4$ include methyl, ethyl, propyl, butyl, pentyl and hexyl (all of these groups may be straight-chain, branched or cyclic). The $C_{1-10}$ alkyl group represented by $R^4$ includes methyl, ethyl, propyl, butyl, pentyl, hexyl, heptyl, octyl, nonyl and decyl (all of these groups may be straight-chain, branched or cyclic). The alkoxy group represented by $R^5$ includes methoxy, ethoxy, propoxy, butoxy, pentyloxy and hexyloxy (all of these groups may be straight-chain, branched or cyclic). One or more halogen atoms in the $C_{1-6}$ haloalkyl groups represented by $R^2$, $R^3$ and $R^4$ and the halogen atom represented by $R^5$ include chlorine, bromine, fluorine and iodine. The aralkyl group represented by $R^4$ includes benzyl, phenetyl, phenylpropyl, methylbenzyl, methylphenetyl and ethylbenzyl.

The $C_{1-10}$ alkyl groups and the alkyl group in the $C_{1-10}$ haloalkyl groups represented by $R^6$ and $R^7$ in the formula [2] include methyl, ethyl, propyl, butyl, pentyl, hexyl, heptyl, octyl, nonyl and decyl (all of these groups may be straight-chain, branched or cyclic).

The $C_{1-5}$ alkyl groups and the alkyl group in the $C_{1-5}$ haloalkyl groups represented by $R^8$ in the formula [3] include methyl, ethyl, propyl, butyl and pentyl (which may be straight-chain, branched or cyclic). The $C_{1-5}$ alkoxy groups represented by $R^8$ include methoxy, ethoxy, propoxy, butoxy and pentyloxy (which may be straight-chain or branched). The $C_{1-10}$ alkyl groups and the alkyl group in the $C_{1-10}$ haloalkyl groups represented by $R^9$ include methyl, ethyl, propyl, butyl, pentyl, hexyl, heptyl, octyl, nonyl and decyl (which may be straight-chain, branched or cyclic). The halogen atom represented by $R^8$, one or more halogen atoms in the $C_{1-5}$ haloalkyl groups represented by $R^8$ and one or more halogen atoms in the $C_{1-10}$ haloalkyl groups represented by $R^9$ include chlorine, bromine, fluorine and iodine.

The $C_{1-5}$ alkyl group and the alkyl group in the $C_{1-5}$ haloalkyl groups represented by $R^{10}$ in the formula [4]

include methyl, ethyl, propyl, butyl and pentyl (which may be straight-chain or branched). The $C_{1-5}$ alkoxy group represented by $R^{10}$ includes methoxy, ethoxy, propoxy, butoxy and pentyloxy (which may be straight-chain or branched).

The halogen atom and one or more halogen atoms in the $C_{1-5}$ haloalkyl group represented by $R^{10}$ include chlorine, bromine, fluorine and iodine.

The $C_{1-5}$ alkyl groups represented by $R^{11}$ in the formula [5] include methyl, ethyl, propyl, butyl and pentyl (which may be straight-chain or branched). The $C_{1-10}$ alkyl groups represented by $R^{12}$ include methyl, ethyl, propyl, butyl, pentyl, hexyl, heptyl, octyl, nonyl and decyl (which may be straight-chain, branched or cyclic). The $C_{1-5}$ alkoxy groups represented by $R^{12}$ include methoxy, ethoxy, propoxy, butoxy and pentyloxy (which may be straight-chain or branched). The aralkyl groups represented by $R^{12}$ include benzyl, phenetyl, phenylpropyl, methylbenzyl, methylphenetyl and ethylbenzyl. The halogen atoms represented by $R^{11}$ include chlorine, bromine, fluorine and iodine.

The halogen atoms represented by $R^{14}$, $R^{15}$ and $R^{16}$ in the formula [7] include chlorine, bromine, fluorine and iodine.

The $C_{1-5}$ alkyl groups represented by $R^{17}$, $R^{18}$, $R^{19}$, $R^{20}$ and $R^{21}$ in the formula [8] include methyl, ethyl, propyl, butyl and pentyl (which may be straight-chain or branched). The $C_{1-5}$ alkoxy groups represented by $R^{17}$–$R^{21}$ include methoxy, ethoxy, propoxy, butoxy and pentyloxy (which may be straight-chain or branched). The halogen atoms represented by $R^{17}$–$R^{21}$ include chlorine, bromine, fluorine and iodine.

The $C_{1-5}$ alkyl groups represented by $R^{23}$ in the formula [9] include methyl, ethyl, propyl, butyl and pentyl (which may be straight-chain or branched).

The $C_{1-5}$ alkyl groups represented by $R^{24}$ in the formula [11] include methyl, ethyl, propyl, butyl and pentyl (which may be straight-chain or branched). The $C_{1-5}$ alkoxy groups represented by $R^{24}$ include methoxy, ethoxy, propoxy, butoxy and pentyloxy (which may be straight-chain or branched). The halogen atoms represented by $R^{24}$ include chlorine, bromine, fluorine and iodine.

The $C_{1-4}$ alkyl groups represented by $R^{25}$ in the formula [12] include methyl, ethyl, propyl and butyl (which may be straight-chain or branched). The $C_{1-6}$ alkyl groups represented by $R^{26}$ include methyl, ethyl, propyl, butyl, pentyl and hexyl (which may be straight-chain, branched or cyclic). The substituted phenyl groups represented by $R^{25}$ include tolyl, ethylphenyl, tert-butylphenyl and chlorophenyl (the substitution position may be o-, m- or p-position). The aralkyl groups represented by $R^{25}$ include benzyl and phenetyl. The halogen atoms represented by $R^{26}$ include chlorine, bromine, fluorine and iodine. The $C_{1-8}$ perfluoroalkyl groups represented by $R^{27}$ include trifluoromethyl, pentafluoroethyl, perfluoropropyl, perfluorobutyl, perfluoropentyl, perfluorohexyl, perfluoroheptyl and perfluorooctyl (which may be straight-chain or branched). The $C_{1-8}$ alkyl groups represented by $R^{27}$ include methyl, ethyl, propyl, butyl, pentyl, hexyl, heptyl and octyl (which may be straight-chain or branched).

Preferred examples of the polymers represented by the formula [1], which can be used for the resist material according to the present invention, are those of the formula [1] in which $R^1$ is hydrogen atom, $R^2$ is hydrogen atom or straight-chain or branched alkyl group having 1–6 carbon atoms, $R^3$ is straight-chain or branched alkyl group having 1–6 carbon atoms, $R^4$ is straight-chain or branched alkyl group having 1–10 carbon atoms, and $R^5$ is hydrogen atom, straight-chain, branched or cyclic alkyl group having 1–6 carbon atoms, a straight-chain, branched or cyclic alkoxy group having 1–6 carbon atoms, a tert-butoxycarbonyloxy group, a tert-butoxycarbonylmethoxy group, a tetrahydropyranyloxy group or an acetyloxy group. More preferred examples of said polymers are those of the formula [1] in which $R^1$ is a hydrogen atom, $R^2$ is a hydrogen atom or a methyl group, $R^3$ is a methyl group or ethyl group, $R^4$ is a straight-chain or branched alkyl group having 1–4 carbon atoms, and $R^5$ is a hydrogen atom, a straight-chain or branched alkyl group having 1–4 carbon atoms, a straight-chain or branched alkoxy group having 1–4 carbon atoms, a tert-butoxycarbonyloxy group, a tert-butoxycarbonylmethoxy group or an acetyloxy group.

The polymers of the formula [1] according to the present invention are specifically characterized by comprising a monomer unit having a functional group which can be easily eliminated with a trace amount of an acid and represented by the formula [13]:

wherein $R^2$, $R^3$ and $R^4$ are as defined above, such as alkoxyalkoxyl group, haloalkoxyalkoxyl group or aralkyloxyalkoxyl group, or a monomer unit represented by the formula [14]:

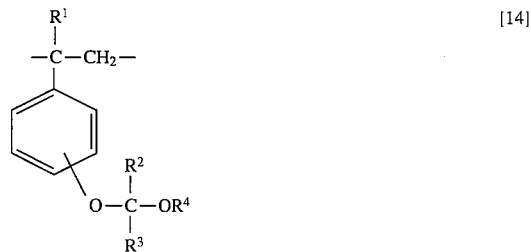

wherein $R^1$, $R^2$, $R^3$ and $R^4$ are as defined above, and a monomer unit capable of controlling the developing speed at the exposed portion to better mask linearity while repressing the influence of undesirable approximation, or a monomer unit represented by the formula [15]:

wherein $R^1$ and $R^5$ are as defined above. Especially the functional groups represented by the formula [13] are highly prone to elimination by the action of an acid as compared with the conventional functional groups such as tert-butoxycarbonyloxy group, tert-butoxy group, tetrahydropyranyloxy group and tert-butoxycarbonylmethyloxy group, and therefore have advantages in that they contribute to the improvement of resolving performance and maintenance of pattern size and shape. The monomer unit of the formula [15] is very effective for improving focus margin and bettering mask linearity, which effect can not be expected from the monomer unit of the formula [14] having a functional group of the formula [13]. This monomer unit is also conducive to the improvement of heat resistance of the polymer.

The monomer unit represented by the formula [14] comprises specifically such monomers as p- or m-hydroxystyrene derivatives, p- or m-hydroxy-α-methylstyrene derivatives, etc. Examples of these monomers are p- or m-1-methoxy-1-methylethoxystyrene, p- or m-1-benzyloxy-1-methylethoxystyrene, p- or m-1-ethoxyethoxystyrene, p- or m-1-methoxyethoxystyrene, p- or m-1-n-butoxyethoxystyrene, p- or m-1-isobutoxyethoxystyrene, p- or m-1-(1,1-dimethylethoxy)-1-methylethoxystyrene, p- or m-1-(1,1-dimethylethoxy)ethoxystyrene, p- or m-1-(2-chloroethoxy)ethoxystyrene, p- or m-1-(2-ethylhexyloxy)ethoxystyrene, p- or m-1-ethoxy-1-methylethoxystyrene, p- or m-1-n-propoxyethoxystyrene, p- or m-1-methyl-1-n-propoxyethoxystyrene, p- or m-1-ethoxypropoxystyrene, p- or m-1-methoxybutoxystyrene, p- or m-1-methoxycyclohexyloxystyrene, p- or m-1-acetyloxy-1-methylethoxystyrene, and p- or m-hydroxy-α-methylstyrene derivatives having the same protective groups as the abovementioned p- or m-hydroxystyrene derivatives.

The polymers according to the present invention are the copolymers comprising a monomer unit of the formula [14] shown above, a monomer unit of the formula [15] shown above and a monomer unit represented by the formula [16]:

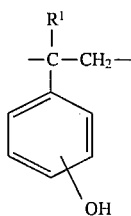

[16]

wherein $R^1$ is as defined above, which has the function of bettering heat resistance of the polymer and its adhesiveness to the substrate. The monomer units of the formula [15] include styrene, p-chlorostyrene, o-, m- or p-methylstyrene, o-, m- or p-methoxystyrene, p-m-butylstyrene, p-ethoxystyrene, m- or p-tert-butoxystyrene, m- or p-tetrahydropyranyloxystyrene, m- or p-tetrahydrofuranyloxystyrene, m- or p-tert-butoxycarbonyloxystyrene, tert-butyl m- or p-vinylphenoxyacetate, m- or p-acetyloxystyrene, and α-methylstyrene derivatives having the same substituents as the abovementioned styrene derivatives.

The monomer unit of the formula [16] comprises the monomers having phenolic hydroxyl groups. Typical examples of such monomers are p- or m-vinylphenol and p- or m-hydroxy-α-methylstyrene.

In the polymers of the formula [1] according to the present invention, the ratios of the monomer unit of the formula [14], the monomer unit of the formula [15] and the monomer unit of the formula [16] are as described below. The ratio of the sum of the monomer unit [14] and the monomer unit [15] to the whole amount of the polymer is preferably 10–90% by mole, more preferably 20–70% by mole for obtaining the maximal improvement of heat resistance of the polymer, its adhesiveness to the substrate and mask linearity.

The ratio of the monomer unit [15] to the whole amount of the polymer is preferably 1–25% by mole, more preferably 2–20% by mole for obtaining an effect of bettering mask linearity and inhibiting drop of resolution.

Of the polymers of the formula [1] according to the present invention, those of the formula [1] wherein $R^1$ is hydrogen atom, $R^2$ is hydrogen atom or methyl group, $R^3$ is methyl group or ethyl group, $R^4$ is straight-chain or branched alkyl group having 1–10 carbon atoms and $R^5$ is hydrogen atom, straight-chain or branched alkyl group having 1–4 carbon atoms, straight-chain or branched alkoxy group having 1–4 carbon atoms or acetyl group, are preferred since the starting monomers are easily available as commercial products and the number of the steps for the synthesis is small. These polymers are also advantageous in terms of cost and can be easily applied to industrial uses.

Listed below are examples of the polymers according to the present invention:
poly[p-(1-methoxy-1-methylethoxy)styrene/p-hydroxystyrene/styrene],
poly[p-(1-methoxy-1-methylethoxy)styrene/p-hydroxystyrene/p-chlorostyrene],
poly[p-(1-methoxy-1-methylethoxy)styrene/p-hydroxystyrene/p-methylstyrene],
poly[p-(1-methoxy-1-methylethoxy)styrene/p-hydroxystyrene/p-methoxystyrene],
poly[p-(1-methoxy-1-methylethoxy)styrene/p-hydroxystyrene/p-tert-butoxystyrene],
poly[p-(1-methoxy-1-methylethoxy)styrene/p-hydroxystyrene/p-acetyloxystyrene],
poly[p-(1-benzyloxy-1-methylethoxy)styrene/p-hydroxystyrene/styrene],
poly[p-(1-benzyloxy-1-methylethoxy)styrene/p-hydroxystyrene/p-chlorostyrene],
poly[p-(1-benzyloxy-1-methylethoxy)styrene/p-hydroxystyrene/p-methylstyrene],
poly[p-(1-benzyloxy-1-methylethoxy)styrene/p-hydroxystyrene/p-ethoxystyrene],
poly[p-(1-benzyloxy-1-methylethoxy)styrene/p-hydroxystyrene/p-tert-butoxystyrene],
poly(p-1-ethoxystyrene/p-hydroxystyrene/styrene),
poly(p-1-ethoxyethoxystyrene/p-hydroxystyrene/p-chlorostyrene),
poly(p-1-ethoxyethoxystyrene/p-hydroxystyrene/p-methylstyrene),
poly(p-1-ethoxyethoxystyrene/p-hydroxystyrene/m-methylstyrene),
poly(p-1-ethoxyethoxystyrene/p-hydroxystyrene/p-methoxystyrene),
poly(p-1-ethoxyethoxystyrene/p-hydroxystyrene/p-ethoxystyrene),
poly(p-1-ethoxyethoxystyrene/p-hydroxystyrene/p-tertbutoxystyrene),
poly(p-1-ethoxyethoxystyrene/p-hydroxystyrene/p-acetyloxystyrene),
poly(p-1-methoxyethoxystyrene/p-hydroxystyrene/styrene),
poly(p-1-methoxyethoxystyrene/p-hydroxystyrene/p-methylstyrene),
poly(p-1-methoxyethoxystyrene/p-hydroxystyrene/m-methylstyrene),
poly(p-1-methoxyethoxystyrene/p-hydroxystyrene/p-chlorostyrene),
poly(p-1-methoxyethoxystyrene/p-hydroxystyrene/p-methoxystyrene),
poly(p-1-methoxyethoxystyrene/p-hydroxystyrene/p-ethoxystyrene),
poly(p-1-methoxyethoxystyrene/p-hydroxystyrene/p-tertbutoxystyrene),
poly(p-1-methoxyethoxystyrene/p-hydroxystyrene/p-acetyloxystyrene),
poly(p-1-n-butoxyethoxystyrene/p-hydroxystyrene/p-n-butylstyrene),
poly(p-1-isobutoxyethoxystyrene/p-hydroxystyrene/o-methoxystyrene),
poly{p-[(1,1-dimethylethoxy)-1-methylethoxy]styrene/p-hydroxystyrene/m-methoxystyrene]},
poly[p-(1,1-dimethylethoxy)-1-methylethoxystyrene/p-hydroxystyrene/o-methylstyrene),
poly[m-1-(2-chloroethoxy)ethoxystyrene/m-hydroxystyrene/styrene], poly[m-1-(2-ethylhexyloxy)ethoxystyrene/m-hydroxystyrene/m-methylstyrene],
poly[p-(1-methoxy-1-methylethoxy)-α-methylstyrene/p-hydroxy- α-methylstyrene/styrene],
poly[p-(1-ethoxy-1-methylethoxy)styrene/p-hydroxystyrene/p-methylstyrene],
poly(p-1-n-propoxyethoxystyrene/p-hydroxystyrene/p-methoxystyrene),
poly[p-(1-methyl-1-n-propoxyethoxy)styrene/p-hydroxystyrene/p-methylstyrene],
poly(m-1-ethoxypropoxystyrene/m-hydroxystyrene/m-tert-butoxystyrene),
poly(p-1-acetyloxy-1-methylethoxystyrene/p-hydroxystyrene/p-tert-butoxystyrene),
poly(m-1-ethoxypropoxystyrene/m-hydroxystyrene/p-methylstyrene),
poly[m-(1-methoxy-1-methylethoxy)styrene/m-hydroxystyrene/m-tert-butoxystyrene],
poly(p-1-methoxychlorohexyloxystyrene/p-hydroxystyrene),
poly[p-(1-ethoxyethoxy)styrene/p-hydroxystyrene/p-tetrahydrofuranyloxystyrene],
poly[p-(1-ethoxyethoxy)styrene/p-hydroxystyrene/p-tetrahydropyranyloxystyrene,
poly[p-(1-methoxyethoxy)styrene/p-hydroxystyrene/p-tetrahydropyranyloxystyrene],
poly[p-(1-ethoxyethoxy)styrene/p-hydroxystyrene/p-tertbutoxycarbonyloxystyrene],
poly[p-(1-methoxyethoxy)styrene/p-hydroxystyrene/p-tert-butoxycarbonyloxystyrene],
poly[p-(1-methoxy-1-methylethoxy)styrene/p-hydroxystyrene/p-tert-butoxycarbonyloxystyrene],
poly[p-(1-ethoxyethoxy)styrene/p-hydroxystyrene/tertbutyl p-vinylphenoxyacetate],
poly[p-(1-methoxyethoxy)styrene/p-hydroxystyrene/tertbutyl p-vinylphenoxyacetate],
poly[m-(1-ethoxyethoxy)styrene/m-hydroxystyrene/m-tert-butoxycarbonyloxystyrene],
poly(m-1-ethoxyethoxystyrene/m-hydroxystyrene/m-tert-butoxystyrene],
poly(m-1-methoxyethoxystyrene/m-hydroxystyrene/m-tert-butoxystyrene), and
poly(p-1-methoxybutoxystyrene/p-hydroxystyrened/styrene).

The polymers according to the present invention can be easily produced from the following six processes (a)–(f).

(a) Process 1

A monomer represented by the formula [17]:

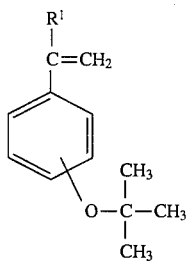

[17]

wherein $R^1$ is as defined above, and an appropriate amount of a monomer represented by the formula [18]:

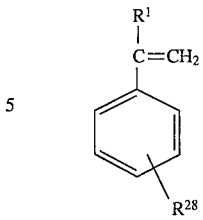

[18]

wherein $R^1$ is as defined above and $R^{28}$ is a hydrogen atom, a halogen atom, a straight-chain, branched or cyclic alkyl group having 1–6 carbon atoms or a straight-chain or branched alkoxy group having 1–3 carbon atoms, are polymerized in the presence of a radical polymerization initiator [for example, an azo type polymerization initiator such as 2,2'-azobisisobutyronitrile, 2,2'-azobis(2,4-dimethylvaleronitrile), 2,2'-azobis(methyl 2-methylpropionate), 2,2'-azobis(ethyl 2-methylpropionate) or 2,2'-azobis(methyl 2-methylbutyrate), or a peroxide type polymerization initiator such as benzoyl peroxide or lauroyl peroxide] in an organic solvent such as toluene, 1,4-dioxane, 1,2-dilaethoxyethane, tetrahydrofuran, iso-propanol, 2-methoxypropanol, 1,3-dioxolane, ethyl acetate or methyl ethyl ketone, in a nitrogen or argon gas stream at 50°–110° C. for 1–10 hours. As the polymerization catalyst, a non-nitrile type catalyst such as 2,2'-azobis(methyl 2-methylpropionate), 2,2'-azobis(ethyl 2-methylbutyrate) is preferably used as this type of catalyst is suited for obtaining a low-molecular weight polymer because of high solubility and also advantageous in terms of safety and virulence. It is also possible to carry out the reaction at an ultra-low temperature in the presence of a suitable catalyst such as butyl lithium to perform anionic polymerization. The reaction is followed by pertinent aftertreatments according to a conventional method to isolate a copolymer represented by the formula [19]:

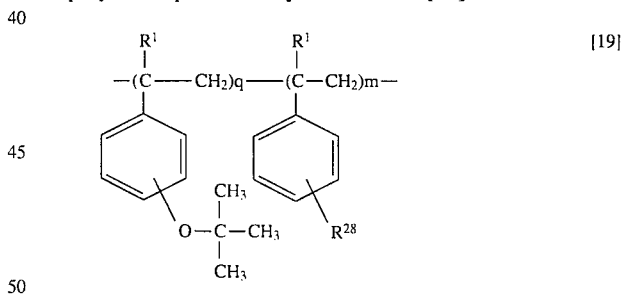

[19]

wherein $R^1$, $R^{28}$ and m are as defined above, and q is an integer of 1 or more, provided that $0.75 \leq q/q+m \leq 0.99$. This copolymer is reacted with a proper acid [for example, a Lewis acid such as sulfuric acid, phosphoric acid, hydrochloric acid or hydrobromic acid or an organic acid such as p-toluenesulfonic acid, malonic acid or oxalic acid] in an organic solvent such as tetrahydrofuran, acetone, methanol, ethanol, isopropanol, n-propanol, n-butanol, sec-butanol, tertbutanol, 1,4-dioxane or 1,3-dioxolane, at 30°–110° C. for 1–20 hours to perfectly eliminate tert-butyl groups which are functional groups. The reaction product is subjected to appropriate after-treatments according to a conventional method to isolate a hydroxystyrene copolymer represented by the formula [20]:

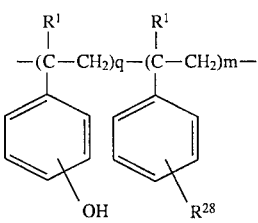

[20]

wherein $R^1$, $R^{28}$, q and m are as defined above. This copolymer is further reacted with an adequate amount of a vinyl ether or isopropenyl ether compound represented by the formula [21]:

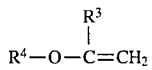

[21]

wherein $R^3$ and $R^4$ are as defined above, in an organic solvent such as tetrahydrofuran, acetone, methyl ethyl ketone, 1,4-dioxane, 1,3-dioxolane, methyl chloride, 1,2-dimethoxyethane, ethyl ether or ethyl acetate in the presence of a suitable catalyst such as sulfuric acid, hydrochloric acid, phosphorus oxychloride, p-toluenesulfonic acid, chlorosulfonic acid pyridine salt, sulfuric acid pyridine salt or p-toluenesulfonic acid pyridine salt at 10°–100° C. for 1–30 hours to chemically introduce the functional group of the formula [13] at a proper rate, followed by adequate after-treatments according to a conventional method to isolate the objective polymer.

(b) Process 2

A monomer of the formula [17] is polymerized in the same manner as described in the Process 1, followed by after-treatments according to a conventional method to isolate a homopolymer represented by the formula [22]:

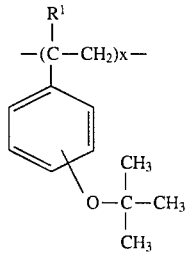

[22]

wherein x=q+m, and $R^1$ is as defined above. This homopolymer is reacted with an appropriate acid [preferably a Lewis acid such as sulfuric acid, phosphoric acid, hydrochloric acid, hydrobromic acid, etc., or an organic acid such as p-toluenesulfonic acid, malonic acid, oxalic acid, etc.] in an organic solvent such as tetrahydrofuran, acetone, 1,4-dioxane, 1,3-dioxolane, methanol, ethanol, n-propanol, iso-propanol, n-butanol, sec-butanol, tert-butanol, etc., at 30°–100° C. for 1–10 hours to eliminate the functional tert-butyl groups at a desired rate. The reaction product is subjected to pertinent after-treatments according to a conventional method to isolate a hydroxystyrene copolymer represented by the formula [23]:

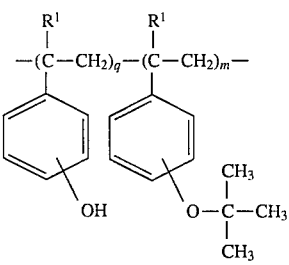

[23]

wherein $R^1$, m and q are as defined above. A functional group of the formula [13] is introduced into this copolymer in the same manner as described in the Process 1 and then after-treatments are carried out according to a conventional method to isolate the objective polymer.

(c) Process 3

A monomer of the formula [24]:

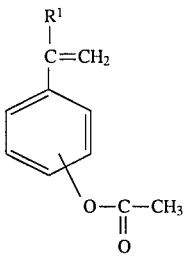

[24]

wherein $R^1$ is as defined above, and an adequate amount of a monomer of the formula [18] are polymerized in the same manner as described in the Process 1, followed by after-treatments according to a conventional method to isolate a copolymer represented by the formula [25]:

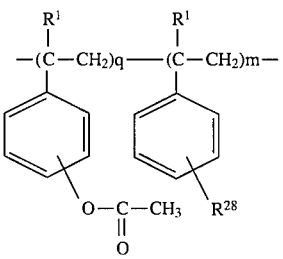

[25]

wherein $R^1$, $R^{28}$, m and q are as defined above. This copolymer is further reacted in a solvent such as tetrahydrofuran, 1,4-dioxane, 1,3-dioxolane, ethyl acetate, methanol, ethanol, n-propanol, iso-propanol, n-butanol, sec-butanol, tert-butanol or water, if possible in a nitrogen gas stream, in the presence of an appropriate base [preferably sodium hydroxide, potassium hydroxide, ammonia water, hydroxylamine, tetramethylammonium hydroxide solution or the like] or an appropriate acid [preferably sulfuric acid, hydrochloric acid, hydrobromic acid, p-toluenesulfonic acid or the like] at 10°–120° C. for 0.5–20 hours to perfectly eliminate the functional acetyl groups. The reaction product is subjected to after-treatments according to a conventional method to isolate a hydroxystyrene copolymer represented by the formula [26]:

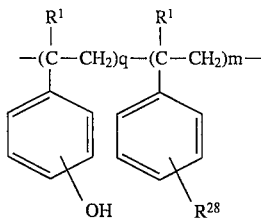

wherein $R^1$, $R^{28}$, m and q are as defined above. A functional group of the formula [13] is introduced into this copolymer in the same manner as described in the Process 1, followed by after-treatments according to a conventional method to isolate the objective polymer.

(d) Process 4

A monomer of the formula [24] is polymerized in the same manner as described in the Process 1, followed by after-treatments according to a conventional method to isolate a homopolymer represented by the formula [27]:

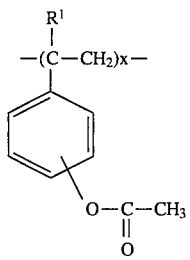

wherein $R^1$ and x are as defined above. This homopolymer is reacted in a solvent such as tetrahydrofuran, 1,4-dioxane, 1,3-dioxolane, ethyl acetate, methanol, ethanol, n-propanol, iso-propanol, n-butanol, sec-butanol, tert-butanol or water, if possible in a nitrogen gas stream, in the presence of an appropriate base [preferably sodium hydroxide, potassium hydroxide, ammonia water, hydroxylamine, tetramethylammonium hydroxide solution or the like] or an appropriate acid [preferably sulfuric acid, hydrochloric acid, phosphoric acid, hydrobromic acid, p-toluenesulfonic acid or the like] at 10°–100° C. for 0.5–10 hours to eliminate the functional acetyl groups at a desired rate. The reaction product is subjected to after-treatments according to a conventional method to isolate a hydroxystyrene copolymer represented by the formula [28]:

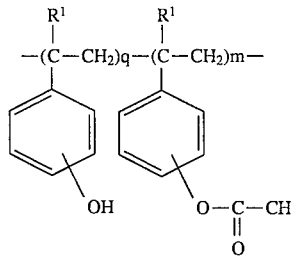

wherein $R^1$, q and m are as defined above. Into this copolymer is introduced a functional group of the formula [13] in the same manner as described in the Process 1 and after-treatments are conducted according to a conventional method to isolate the objective polymer.

(e) Process 5

A monomer of the formula [17] and an appropriate amount of a monomer of the formula [24] are polymerized in the same manner as described in the Process 1, followed by after-treatments according to a conventional method to isolate a copolymer represented by the following formula [29]:

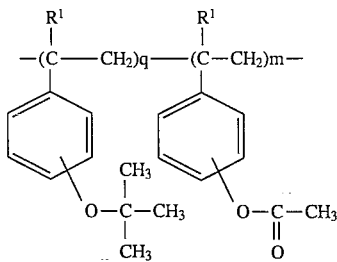

wherein $R^1$, q and m are as defined above, or a copolymer represented by the following formula [30]:

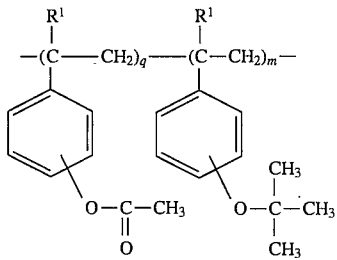

wherein $R^1$, q and m are as defined above. This copolymer is reacted in a solvent such as tetrahydrofuran, 1,4-dioxane, 1,3-dioxolane, ethyl acetate, methanol, ethanol, n-propanol, iso-propanol, n-butanol, sec-butanol, tert-butanol or water, if possible in a nitrogen gas stream, in the presence of an appropriate base [preferably sodium hydroxide, potassium hydroxide, ammonia water, hydroxylamine, tetramethylammonium hydroxide solution or the like] at 10°–120° C. for 0.5–20 hours to perfectly eliminate the functional acetyl groups. Conventional after-treatments follow to isolate a hydroxystyrene copolymer of the formula [23] and this copolymer is treated in accordance with Process 2 to isolate the objective polymer.

(f) Process 6

A homopolymer of the formula [22] obtained in Process 2 or a homopolymer of the formula [27] obtained in process 4 is reacted in a solvent such as tetrahydrofuran, 1,4-dioxane, 1,3-dioxolane, ethyl acetate, methanol, ethanol, n-propanol, iso-propanol, n-butanol, sec-butanol, tert-butanol or water in the presence of an adequate acid [preferably sulfuric acid, hydrochloric acid, phosphoric acid, hydrobromic acid, p-toluenesulfonic acid, malonic acid, oxalic acid or the like] at 10°–70° C. for 0.5–10 hours to perfectly eliminate the functional tert-butyl or acetyl groups. The reaction product is properly treated according to a conventional method to isolate a hydroxystyrene polymer represented by the formula [31]:

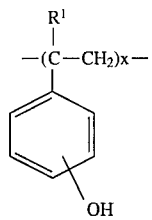

wherein $R^1$ and x are as defined above. This homopolymer is reacted with an appropriate amount of hydroxyl group protective agent such as di-tert-butyl dicarbonate, 2,3-dihydrofuran, 2,3-dihydropyran, tert-butyl monochloroacetate, acetyl chloride, acetic anhydride, isobutene, dimethylsulfuric acid, methyl iodide or the like in an organic solvent such as tetrahydrofuran, 1,4-dioxane, ethyl acetate, methyl ethyl ketone, acetone, methylene chloride, 1,3-dioxolane, methanol, ethanol, n-propanol, iso-propanol, n-butanol, sec-butanol, tert-butanol, methylene chloride or the like in the presence of a pertinent base such as potassium hydroxide, sodium hydroxide, sodium carbonate, potassium carbonate, triethylamine, N-methyl-2-pyrrolidone, piperidine, tetramethylammonium hydroxide solution or the like or a suitable acid such as sulfuric acid, hydrochloric acid, phosphoric acid, phosphorus oxychloride, p-toluenesulfonic acid pyridine salt, sulfuric pyridine salt or the like at 10°–100° C. for 0.5–30 hours, and the reaction product is treated according to a conventional method to yield a copolymer represented by the formula [32]:

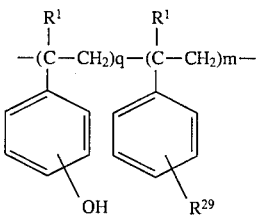

wherein $R^{29}$ is tert.-butoxycarbonyloxy group, tetrahydrofuranyloxy group, tetrahydropyranyloxy group, tert-butoxycarbonylmethoxy group, acetyl group, tert-butoxy group or methoxy group, and $R^1$ is as defined above. Into this copolymer is introduced a functional group of the formula [13] in the same manner as described in the Process 1, followed by after-treatments according to a conventional method to isolate the objective polymer.

The molecular weight of the polymers according to the present invention is not specifically defined as far as the polymers are usable as resist material, but preferably the weight-average molecular weight of the polymers as determined by GPC method using polystyrene as standard is usually about 1,000–100,000, more preferably about 3,000–50,000.

The photosensitive compounds capable of generating an acid upon exposure to light (hereinafter referred to as "photoacid generator") used in the present invention include the compounds of the following formulae [2], [3], [5], [6], [9] and [12]:

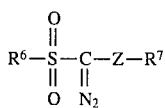

wherein $R^6$, $R^7$ and Z are as defined above.

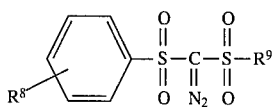

wherein $R^8$ and $R^9$ are as defined above.

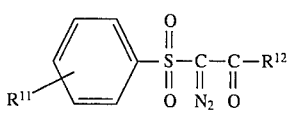

wherein $R^{11}$ and $R^{12}$ are as defined above.

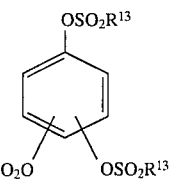

wherein $R^{13}$ is as defined above.

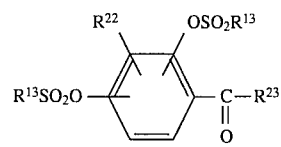

wherein $R^{13}$, $R^{22}$ and $R^{23}$ are as defined above.

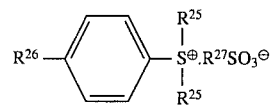

wherein $R^{25}$, $R^{26}$ anti $R^{27}$ are as defined above.

Listed below are preferred examples of the photoacid generators usable in the present invention.

Compounds of the formula [2]:
1-cyclohexylsulfonyl-1-(1,1-dimethylethylsulfonyl)diazomethane,
bis(1,1-dimethylethylsulfonyl)diazomethane,
bis(1-methylethylsulfonyl)diazomethane,
bis(cyclohexylsulfonyl)diazomethane,
1-cyclohexylsulfonyl-1-cyclohexylcarbonyldiazomethane,
1-diazo-1-cyclohexylsulfonyl-3,3-dimethylbutan-2-one,
1-diazo-1-methylsulfonyl-4-phenylbutan-2-one,
1-diazo-1-(1,1-dimethylethylsulfonyl)-3,3-dimethyl-2-butanone,
1-acetyl-1-(1-methylethylsulfonyl)diazomethane, etc.

Compounds of the formula [3]:
bis(p-toluenesulfonyl)diazomethane,
methylsulfonyl-p-toluenesulfonyldiazomethane,
1-diazo-1-(p-toluenesulfonyl)-3,3-dimethyl-2-butanone,
bis(p-chlorobenzenesulfonyl)diazomethane,
cyclohexylsulfonyl-p-toluenesulfonyldiazomethane, etc.

Compounds of the formula [5]:
1-p-toluenesulfonyl-1-cyclohexylcarbonyldiazomethane,
1-diazo-1-(p-toluenesulfonyl)-3,3-dimethylbutan-2-one,
1-diazo-1-benzenesulfonyl-3,3-dimethylbutan-2-one,
1-diazo-1-(p-toluenesulfonyl)-3-methylbutan-2-one, etc.

Compounds of the formula [6]:
1,2,3-tris(trifluoromethanesulfonyloxy)benzene,
1,2,3-tris(2,2,2-trifluoroethanesulfonyloxy)benzene,
1,2,3-tris(2-chloroethanesulfonyloxy)benzene,
1,2,3-tris(p-trifluoromethylbenzenesulfonyloxy)benzene,
1,2,3-tris(p-nitrobenzenesulfonyloxy)benzene,
1,2,3-tris(2,3,4,5,6-pentafluorobenzenesulfonyloxy)benzene,
1,2,3-tris(p-fluorobenzenesulfonyloxy)benzene,
1,2,3-tris(methanesulfonyloxy)benzene,
1,2,4-tris(p-trifluoromethyloxybenzenesulfonyloxy)benzene,
1,2,4-tris(2,2,2-trifluoroethanesulfonyloxy)benzene,
1,2,4-tris(2-thienylsulfonyloxy)benzene,
1,3,5-tris(methanesulfonyloxy)benzene,
1,3,5-tris(trifluoromethanesulfonyloxy)benzene,
1,3,5-tris(2,2,2-trifluoroethanesulfonyloxy)benzene,
1,3,5-tris(p-nitrobenzenesulfonyloxy)benzene,
1,3,5-tris(2,3,4,5,6-pentafluorobenzenesulfonyloxy)benzene, 1,3,5-tris(p-fluorobenzenesulfonyloxy)benzene,
1,3,5-tris(2-chloroethanesulfonyloxy)benzene, etc.

Compounds of the formula [9]:
2,3,4-tris(methanesulfonyloxy)benzophenone,
2,3,4-tris(trifluoromethanesulfonyloxy)benzophenone,
2,3,4-tris(2-chloroethanesulfonyloxy)benzophenone,
2,3,4-tris(p-trifluoromethylbenzenesulfonyloxy)benzophenone,
2,3,4-tris(p-nitrobenzenesulfonyloxy)benzophenone,
2,3,4-tris(p-trifluoromethoxybenzenesulfonyloxy)benzophenone,
2,3,4-tris(p-fluorobenzenesulfonyloxy)acetophenone,
2,3,4-tris(2,3,4,5,6-pentafluorobenzenesulfonyloxy)acetophenone,
2,3,4-tris(2-nitrobenzenesulfonyloxy)acetophenone,
2,3,4-tris(2,5-dichlorobenzenesulfonyloxy)acetophenone,
2,3,4-tris(2,3,4-trichlorobenzenesulfonyloxy)acetophenone,
2,2',4,4'-tetra(methanesulfonyloxy)benzophenone,
2,2',4,4'-tetra(2,2,2-trifluoroethanesulfonyloxy)benzophenone,
2,2',4,4'-tetra(2-chloroethanesulfonyloxy)benzophenone,
2,2',4,4'-tetra(2,5-dichlorobenzenesulfonyloxy)benzophenone,
2,2',4,4'-tetra(2,4,6-trimethylbenzenesulfonyloxy)benzophenone,
2,2',4,4'-tetra(m-trifluoromethylbenzenesulfonyloxy)benzophenone, etc.

Compounds of the formula [12]:
triphenylsulfonium trifluoromethanesulfonate, triphenylsulfonium perfluorooctanesulfonate, diphenyl-p-tolylsulfonium perfluorooctanesulfonate, tris(p-tolyl)sulfonium perfluorooctanesulfonate, tris(p-chlorobenzene)sulfonium trifluoromethanesulfonate, tris(p-tolyl)sulfonium trifluoromethanesulfonate, trimethylsulfonium trifluoromethanesulfonate, dimethylphenylsulfonium trifluoromethanesulfonate, dimethyltolylsulfonium trifluoromethanesulfonate, dimethyltolylsulfonium perfluorooctanesulfonate, triphenylsulfonium p-toluenesulfonate, triphenylsulfonium methanesulfonate, triphenylsulfonium n-butanesulfonate, triphenylsulfonium n-octanesulfonate, triphenylsulfonium 1-naphthalenesulfonate, triphenylsulfonium 2-naphthalenesulfonate, triphenylsulfonium 10-camphorsulfonate, triphenylsulfonium 2,5-dichlorobenzenesulfonate, diphenyltolylsulfonium 1,3,4-trichlorobenzenesulfonate, dimethyltolylsulfonium p-toluenesulfonate, diphenyltolylsulfonium 2,5-dichlorobenzenesulfonate, etc.

The resist material of the present invention is characterized by combined use of (a) a polymer of the formula [1] and (b) at least one photoacid generator selected from the group consisting of the photosensitive compounds of the formulae [2], [3], [5], [6], [9] and [12]. In case two or more types of photoacid generator are used in admixture, combination of a compound of the formula [2], which has good light permeability at around 248.4 nm and is capable of maintaining high transparency of resist material and which also has little PEB temperature dependency and can generate a weak acid upon exposure to light, and at least one compound selected from the group consisting of the compounds of the formulae [3], [5], [6], [9] and [12], which has high acid generating potency for a given rate of exposure and can generate a strong acid, is especially preferred in consideration of the improvement of pattern shape at its tail and inhibition of scumming.

In the case of single use of a photoacid generator of the formula [12] which is very effective for preventing footing of the pattern or scumming, defective pattern formation may be caused due to delay time, but this problem can be overcome by applying overcoating. Also, change of pattern size may take place in case of using a photoacid generator of the formula [12], but this can be prevented by increasing the ratio of the monomer unit of the formula [15] in the polymer of the formula [1].

Regarding the mixing ratio of the photoacid generators in case two or more photoacid generators are used, a photoacid generator of the formula [3], [5], [6], [9] or [12] is added in a ratio of 1–70 parts by weight, preferably 10–50 parts by weight, to 100 parts by weight of a photoacid generator of the formula [2] as this range of ratio is most suited for inhibiting formation of scums or tails at the bottom of the pattern and allows stable maintenance of pattern shape and size without inducing the problem of delay time.

Various triphenylsulfonium salts and diphenyliodonium salts (anions of these onium salts are $PF_6^-$, $AsF_6^-$, $BF_4^-$, etc.) and tris(trichloromethyl)-striazine/triethanolamine have been known as photoacid generators beside those of the present invention, but when these photoacid generators are used singly in the production of chemically amplified resist material, the generated acid may be evaporated away from the resist film surface after exposure and is also very susceptible to the influence of the atmosphere gas such as amines since the acid (Lewis acid) generated on exposure is a strong acid and also highly volatile, and consequently, with the lapse of time during operation from exposure to development, there arise the cumbrous problems such as T-shaping of the formed pattern, large variation of the pattern shape and size, and no formation of a pattern. The above conventional photoacid generators also involve the problems relating to storage stability, such as change of sensitivity during storage and failure to form a pattern.

As for the solvent used in the present invention, any solvent can be used as far as it is capable of dissolving the polymers, photoacid generators and other additives such as ultraviolet absorbent and surfactant used in the present invention, but usually it is recommended to use a solvent having good film forming properties and showing absorption at around 220–400 nm. Examples of such solvents include, but are not limited to, methyl cellosolve acetate, ethyl cellosolve acetate, propylene glycol monomethyl ether acetate, propylene glycol monoethyl ether acetate, methyl lactate, ethyl lactate, 2-ethoxyethyl acetate, methyl pyruvate, ethylpyruvate, methyl 3-methoxypropionate, ethyl 3-methoxypropionate, N-methyl-2-pyrrolidone, cyclohexanone, methyl ethyl ketone, 2-heptanone, 1,4-dioxane, diethylene glycol monomethyl ether, diethylene glycol dimethyl ether and ethylene glycol monoisopropyl ether.

The resist material of the present invention usually consists of said three components (a polymer according to this invention, a photoacid generator and a solvent), but if necessary an ultraviolet absorbent may be added. Ultraviolet absorbents usable in the present invention include 9-diazofluorene and its derivatives, 1-diazo-2-tetralone, 2-diazo-1-tetralone, 9-diazo-10-phenanthrone, 9-(2-methoxyethoxy)methylanthracene, (2-ethoxyethoxy)methylanthracene, 9-anthracenemethyl acetate, 9-anthracenemethyl propionate, etc.

It is also possible to add one or more of dye, sensitivity adjustor, plasticizer and surfactant which are commonly used in the art.

Sensitivity adjustors usable in this invention include polyvinylpyridine, poly(vinylpyridine/methyl methacrylate), pyridine, piperidine, tetramethylammonium hydroxide, triethylamine and N-methyl-2-pyrrolidone.

Plasticizers include diethyl phthalate, dibutyl phthalate and dipropyl phthalate.

Surfactants include nonionic surfactants and fluorine-containing nonionic surfactants.

The pattern forming process according to the present invention comprises essentially the steps of coating the resist material described above on a substrate, heating and then exposing the coating film to light with a wavelength of 300 nm or less through a mask, further heating the exposed coating film as required, and developing it with a developing solution.

Pattern formation using the resist material according to the present invention can be accomplished, for example, in the following way.

Resist material of this invention is coated on a semiconductor substrate such as silicon wafer to a coating thickness of 0.5–2.0 μm (about 0.1–0.5 μm in case it is used as top layer of a 3-layer coat) and prebaked in an oven at 70°–130° C. for 10–30 minutes or on a hot plate at 70°–130° C. for 1–2 minutes. This resist film is exposed to deep ultraviolet light of 300 nm or less at an exposure dose of about 1–100 mJ/cm$^2$ through a mask for forming a desired pattern, then baked at 70°–150° C. for 1–2 minutes and developed with a 0.1–5% tetramethylammonium hydroxide (TMAH) solution for about 0.5–3 minutes by a conventional method such as dipping, puddling or spraying to form the desired pattern on the substrate.

The mixing ratio of polymer (a) and photoacid generator (b) in the resist material according to the present invention is 1–30 parts by weight, preferably 1–20 parts by weight of (b) to 100 parts by weight of (a). The amount of solvent (c) in the resist material of this invention is not specifically defined as far as no impediment is caused when a positive resist material obtained by dissolving a polymer of this invention and a photoacid generator in the solvent is coated on a substrate, but usually the ratio of solvent (c) is 100–2,000 parts by weight, preferably 150–1,000 parts by weight, to 100 parts by weight of polymer (a).

As developing solution used in the pattern forming processes such as described above, an alkali solution of a suitable concentration that can enlarge the difference in degree of dissolution between the exposed and the non-exposed portions is properly selected depending on the solubility of resist material. Usually the concentration of said alkali solution is selected from the range of 0.01–20%. The alkali solutions usable as developer include the aqueous solutions containing organic amines such as TMAH, choline, triethanolamine, etc., or inorganic alkalis such as NaOH, KOH, etc.

The polymers according to the present invention, as described above, typically contain a monomer unit of the formula [14] having a functional group of the formula [13], so that these polymers, as compared with the conventional polymers of the same type, have a greater disposition to become alkalisoluble with easier elimination of functional groups in the presence of an acid. This is conducive to enhancement of resolving performance and stable maintenance of pattern shape and size throughtout the period of operation from exposure till heat treatment (baking). Further, the polymers according to the present invention, owing to incorporation of hydroxystyrene unit of the formula [16], have heat resistance, dry etch durability and high adhesiveness to the substrate. Also, the polymers according to the present invention, owing to its monomer unit of the formula [15], can control the developing speed at the exposed portion to provide a sufficient focus margin and good mask linearity. They also contribute to smoothing the pattern side wall. Then this monomer unit also contributes to the improvement of heat resistance of the polymer.

The monomer units represented by the formula [15] include those which change into hydroxystyrene unit soluble in alklai developing solution on elimination of the functional groups by the action of an acid (such monomer units including acetyloxy group, methoxy group, tert-butoxy group, tetrahydrofuranyl group, tetrahydropyranyl group, tert-butoxycarbonyloxy group, tert-butoxycarbonylmethoxy group, etc.), but in the present invention the monomer unit of the formula [14] having a functional group of the formula [13] can eliminate the functional groups far more fastly and easily under the action of an acid to become hydroxystyrene unit.

JP-A-6-194842 (EPC Patent No. 0588544) discloses polymers consisting of three monomer units, but this patent concerns an electron ray resist and differs in its object from the present invention which relates to a resist material for forming a positive pattern by using deep ultraviolet light with a wavelength of 300 nm or less. Therefore, when a pattern is formed with ultraviolet light, such as KrF excimer laser light, by using the resist composition disclosed in the above patent, there arise such problems as poor resolution of the bottom portion of the pattern, formation of scums and their transfer during etching, so that this resist composition is unsuited for pattern formation with ultraviolet light.

What is most remarkable in the present invention is the fact that by combining a polymer consisting of three monomer units according to the present invention and a specific photoacid generator also disclosed by the present invention, it has been realized to provide a resist material which is freed of various problems encountered in conventional resist pattern formation using ultraviolet light such as deep ultraviolet light or KrF excimer laser light, and which has various advantages already mentioned above and is suited for pattern formation by use of deep ultraviolet light or KrF excimer laser light as exposure source. Further, the resist material of the present invention is effective for eliminating scums or tails at the bottom portion of the resist pattern in case two or more types of photoacid generator according to the present invention are used in combination. This phenomenon can be accounted for by the fact that a photoacid generator capable of generating a stronger acid or capable of inducing greater acid diffusion has a higher ability to eliminate the functional groups of the polymer uniformly down to the bottom of the resist. In view of this, the combination of a photoacid generator of the formula [2] and a photoacid generator of the formula [3], [9] or [12] is considered to give the best result in application to the resist material according to the present invention.

The resist material of the present invention is best suited for pattern formation by use of deep ultraviolet light or KrF excimer laser light, but it has been confirmed that an acid is also generated to induce chemical amplification on exposure to i-line light, electron beam or soft X-rays, so that the resist material of the present invention can be used for forming a pattern by exposure to a small dose of deep ultraviolet light, KrF excimer laser light, i-line light, electron beam or soft X-rays by making use of the chemically amplifying function of the material.

The principle of the present invention is described with reference to embodiments thereof.

When the resist film is exposed to KrF excimer laser light or deep ultraviolet light, an acid is generated at the exposed portion according to the following formulae 1, 2, 3, 4 or 5:

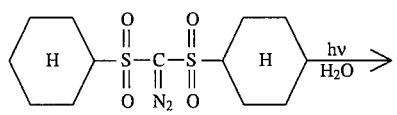 (1)

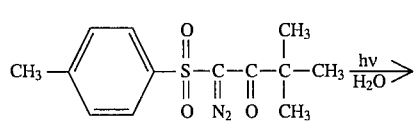

 (2)

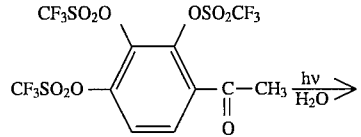

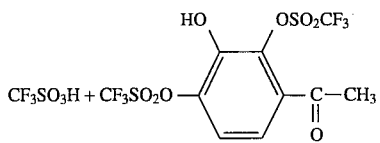 (3)

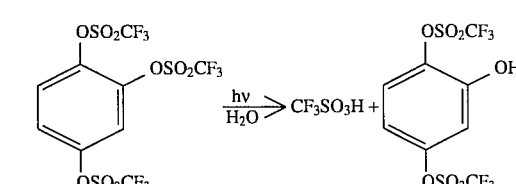

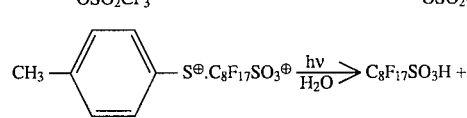 (4)

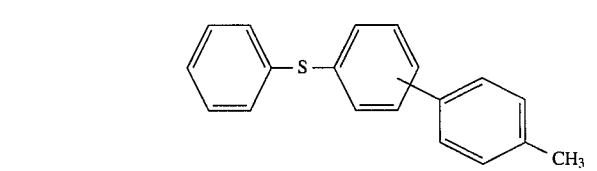 (5)

When the exposed resist film is heated, a specific functional group (1-ethoxyethoxy group is exemplified in the formula 6) of the polymer of the present invention undergoes a chemical change by the generated acid according to the reaction of the following formula 6 to become a hydroxyl group, with the result that the polymer becomes alkali-soluble and is eluted out in the developing solution in the course of development.

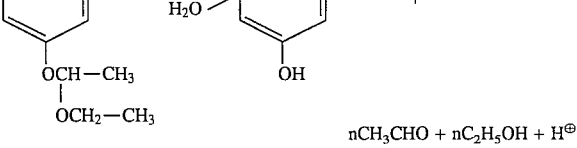 (6)

$nCH_3CHO + nC_2H_5OH + H^{\oplus}$

At the non-exposed portion, on the other hand, no chemical changes occurs on heating since no acid is generated, and there is rather induced a phenomenon that the hydrophilic group moiety of the polymer used for the purpose of strengthening adhesion to the substrate is protected against infiltration with the alkaline developing solution. Thus, when pattern formation is carried out using the resist material of the present invention, there is produced a large difference in solubility in alkaline developing solution between the exposed portion and the non-exposed portion, and further, since the polymer at the non-exposed portion has strong adhesiveness to the substrate, no film peeling takes place during development, and consequently a positive pattern with good contrast is formed. It is also notable that since the acid generated on exposure according to the formula 6 acts in the manner of a catalyst, there is no need of conducting exposure more than necessary for generating a required acid, so that the amount of energy required for exposure can be reduced.

The present invention will be described in further detail with reference to Examples, Synthesis Examples, Reference Examples and Comparative Examples, but it should be noted that these examples are merely intended to be illustrative and not to be construed as limiting the scope of the invention.

Part of the photoacid generators used in the following Examples and Comparative Examples were synthesized according to the methods described in JP-A-4-210960 (U.S. Pat. No. 5,216,135), JP-A-4-211258 (U.S. Pat. No. 5,350,660; EPC Patent 0,440,374), JP-A-5-249682 (EPC Patent 0,520,642), Y. Endo et al: Chem. Pharm. Bull., 29(12), 3753 (1981); M. Desbois et al: Bull. Chim. Soc. France, 1974, 1956, or C. D. Beard et al: J. Org. Chem., 38, 3673 (1973); Hashimoto et al: JPN Chem. Mag., 87(10), 1069 (1966), etc.

SYNTHESIS EXAMPLE 1

Synthesis of poly[p-(1-ethoxyethoxy)styrene/hydroxystyrene/p-methylstyrene]

(1) A solution of p-tert-butoxystyrene (100 g, 0.567 mole) and p-methylstyrene (3.54 g, 0.03 mole) in 1,4-dioxane containing catalytic amount of 2,2'-azobis(methyl 2-methylpropionate) was polymerized at 80° C. for 6 hours under nitrogen. After cooling, the reaction mixture was poured into aqueous methanol (5 l) and the polymer was precipitated. The polymer was filtered, washed with methanol and dried under reduced pressure to afford 92.3 g of poly(p-tert-butoxystyrene/p-methyl styrene) as white powder having Mw 20000 (GPC with polystyrene calibration). The polymer was found to have p-tert-butoxystyrene unit and p-methylstyrene unit in a molar ratio of ca. 95:5 based on $^1$HNMR.

(2) A solution of poly(p-tert-butoxystyrene/p-methylstyrene) (70 g) obtained in above (1) and conc. hydrochloric acid (100 ml) in 1,4-dioxane was reacted for 4 hours at 70°–80° C. with stirring. After cooling, the reaction mixture was poured into H$_2$O (5 l) and the polymer was precipitated. The polymer was filtered, washed with H$_2$O and dried under reduced pressure to give 47.6 g of poly(p-hydroxystyrene/p-methylstyrene) as white powder. The polymer was found to have p-hydroxystyrene unit and p-methylstyrene unit in a molar ratio of ca. 95:5 based on $^1$HNMR. (3) To a solution of poly(p-hydroxystyrene/p-methylstyrene) (15.0 g) obtained in above (2) and ethyl vinyl ether (3.5 g) in 1,4-dioxane (150 ml), a catalytic amount of pyridinium p-toluenesulfonate was added and reacted with stirring at room temperature for 24 hours. The reaction mixture was poured into H$_2$O (5 l) and the polymer was precipitated. The precipitate was filtered, washed with H$_2$O and dried under reduced pressure to afford 11.5 g of poly[p-(1-ethoxyethoxy)styrene/p-hydroxystyrene/p-methylstyrene] as white powder having Mw 20000 (GPC with polystyrene calibration). The polymer was found to have p-(1-ethoxyethoxy)styrene unit, p-hydroxystyrene unit and p-methylstyrene unit in a molar ratio of ca. 35:60:5 based on $^1$HNMR.

SYNTHESIS EXAMPLE 2

Synthesis of poly[p-(1-ethoxyethoxy)styrene/p-hydroxystyrene/styrene]

(1) Using p-tert-butoxystyrene (81.1 g, 0.46 mole) and styrene (4.6 g, 0.04 mole), the polymerization and the treatment were carried out in the same manner as described in Synthesis Example 1, (1), to give 77.1 g of poly(p-tert-butoxystyrene/styrene) as white powders having Mw 20000 (GPC with polystyrene calibration). The polymer was found to have p-tertbutoxystyrene unit and styrene unit in a molar ratio of ca. 92:8 based on $^1$HNMR.

(2) Using poly(p-tert-butoxystyrene/styrene) (70 g) obtained in above (1), the reaction and the treatment were carried out in the same manner as described in Synthesis Example 1, (2), to afford 44.0 g of poly(p-hydroxystyrene/styrene) as white powder. The polymer was found to have p-hydroxystyrene unit and styrene unit in a molar ratio of ca. 92:8 based on $^1$HNMR.

(3) Using poly(p-hydroxystyrene/styrene) (15.0 g) obtained in above (2) and ethyl vinyl ether (3.2 g), the reaction and the treatment were carried out in the same manner as described in Synthesis Example 1, (3), to give 14.1 g of poly[p-(1-ethoxyethoxy)styrene/p-hydroxystyrene/p-methylstyrene] as white powder having Mw 20000 (GPC with polystyrene calibration). The polymer was found to have p-(1-ethoxyethoxy)styrene unit, p-hydroxystyrene unit and styrene unit in a molar ratio of ca. 32:60:8 based on $^1$HNMR.

Synthesis Example 3

Synthesis of poly[p-(1-ethoxyethoxy)styrene/p-hydroxystyrene/p-tert-butoxystyrene]
(1) A solution of p-tert-butoxystyrene (17.6 g) in iso-propanol containing catalytic amount of 2,2'-azobis(methyl 2-methylpropionate) was polymerized at 80° C. for 6 hours under nitrogen. After cooling, the reaction mixture was poured into aqueous methanol (1 l) and the polymer was precipitated. The polymer was filtered, washed with methanol and dried under reduced pressure to give 16.7 g of poly(p-tert-butoxystyrene) as white powder having Mw 20000 (GPC with polystyrene calibration).

(2) A suspension of poly(p-tert-butoxystyrene) (15.0 g) obtained in above (1), and conc. hydrochloric acid (15 ml) in iso-propanol was reacted for 4 hours at 70°–80° C. with stirring. After colling, the reaction mixture was poured into H$_2$O (1 l) and the polymer was precipitated. The polymer was filtered, washed with H$_2$O and dried under reduced pressure to give 9.6 g of poly(p-hydroxystyrene/p-tert-butoxy styrene) as white powder. The polymer was found to have p-hydroxystyrene unit and p-tert-butoxystyrene unit in a molar ratio of ca. 90:10 based on $^1$HNMR.

(3) To a solution of poly(p-hydroxystyrene/p-tert-butoxystyrene) (15.7 g) obtained in above (2) and ethyl vinyl ether (3.2 g) in 1,4-dioxane (140 ml), a catalytic amount of pyridinium p-toluenesulfonate was added and reacted with stirring at room temperature for 24 hours. The reaction mixture was poured into H$_2$O (3 l) and the polymer was precipitated. The precipitate was filtered, washed with H$_2$O and dried under reduced pressure to give 16.0 g of poly[p-(1-ethoxyethoxy-styrene/p-hydroxystyrene/p-tert-butoxystyrene] as white powder having Mw 20000 (GPC with polystyrene calibration). The polymer was found to have p-(1-ethoxyethoxy)styrene unit, p-hydroxystyrene unit and p-tertbutoxystyrene unit in a molar ratio of ca. 30:60:10 based on $^1$HNMR.

Synthesis Example 4

Synthesis of poly[p-(1-methoxy-1-methylethoxy)-styrene/p-hydroxystyrene/p-tert-butoxystyrene]
To a solution of poly(p-hydroxystyrene/p-tert-butoxystyrene) (15.7 g) obtained in Synthesis Example 3, (2) and 2-methoxy-1-propene (3.2 g) in tetrahydrofuran (120 ml), a catalytic amount of phosphorous oxychloride was added and reacted with stirring for 16 hours at room temperature. After reaction, the reaction mixture was poured into H$_2$O (5 l) and the polymer was precipitated. The precipitate was filtered, washed with H$_2$O and dried under reduced pressure to afford 14.7 g of poly[p-(1-methoxy-1-methylethoxy)styrene/p-hydroxystyrene/p-tertbutoxystyrene] as white powder having Mw 20000 (GPC with polystyrene calibration). The polymer was found to have p-(1-methoxy-1-methylethoxy)styrene unit, p-hydroxystyrene unit and p-tert-butoxystyrene unit in a molar ratio of ca. 30:60:10 based on $^1$HNMR.

Synthesis Example 5

Synthesis of poly[p-(1-ethoxyethoxy)styrene/p-hydroxystyrene/p-methoxystyrene]
(1) Using p-tert-butoxystyrene (77.6 g, 0.44 mole) and p-methoxystyrene (8.1 g, 0.06 mole), the polymerization and treatment were carried out in the same manner as described in Synthesis Example 1, (1), to give 77.1 g poly(p-tert-butoxystyrene/p-methoxystyrene) as white powder having Mw 20000 (GPC with polystyrene calibration). The polymer was found to have p-tert-butoxystyrene unit and p-methoxystyrene unit in a molar ratio of ca. 88:12 based on $^1$HNMR.
(2) Using poly(p-tert-butoxystyrene/p-methoxystyrene) (68.5 g) obtained in above (1), the reaction and the treatment were carried out in the same manner as described in Synthesis Example 1, (2), to give 43.9 g of poly(p-hydroxystyrene/p-methoxystyrene) as white powder. The polymer was found to have p-hydroxystyrene unit and p-methoxystyrene unit in a molar ratio of ca. 88:12 based on $^1$HNMR.
(3) Using poly(p-hydroxystyrene/p-methoxystyrene) (15.2 g) obtained in above (2) and ethyl vinyl ether (2.9 g), the reaction and the treatment were carried out in the same manner as described in Synthesis Example 1, (3), to afford 14.4 g of poly[p-(1-ethoxy-ethoxy)styrene/p-hydroxystyrene/p-methoxystyrene] as white powder having Mw 20000 (GPC with polystyrene calibration). The polymer was found to have p-(1-ethoxyethoxy)styrene unit, p-hydroxystyrene unit and p-methoxystyrene unit in a molar ratio of ca. 30:58:12 based on $^1$HNMR.

Synthesis Example 6

Synthesis of poly[p-(1-benzyloxy-1-methylethoxy-styrene/p-hydroxystyrene/p-tert-butoxystyrene]
(1) A solution of poly(p-tert-butoxystyrene) (15.0 g) obtained in Synthesis Example 3, (1) and conc. hydrochloric acid (20 ml) in 1,4-dioxane was reacted with stirring for 4 hours at 70°–80° C. After cooling, the reaction mixture was poured into $H_2O$ (1 l) and the polymer was precipitated. The precipitate was filtered, washed with $H_2O$ and dried under reduced pressure to give 9.4 g of poly(p-hydroxystyrene/p-tert-butoxystyrene) as white powder. The polymer was found to have p-hydroxystyrene unit and p-tert-butoxystyrene unit in a molar ratio of ca. 95:5 based on $^1$HNMR.
(2) Using poly,[p-hydroxystyrene/p-tertbutoxystyrene) (15.4 g) obtained in above (1) and 1-benzyloxy- 1-propene (5.9 g), the reaction and the treatment were carried out in the same manner as described in Synthesis Example 4, to give 13.4 g of poly[p-(1-benzyloxy-1-methylethoxy)styrene/p-hydroxystyrene/p-tert-butoxystyrene] as white powder having Mw 20000 (GPC with polystyrene calibration). The polymer was found to have p-(1-benzyloxy-1-methylethoxy)styrene unit, p-hydroxystyrene unit and p-tertbutoxystyrene unit in a molar ratio of ca. 30:60:10 based on $^1$HNMR.

Synthesis Example 7

Synthesis of poly[p-(1-methoxyethoxy)styrene/p-hydroxystyrene/p-chlorostyrene]
(1) Using p-tert-butoxystyrene (83.7 g, 0.475 mole) and p-chlorostyrene (3.5 g, 0.025 mole), the polymerization and the treatment were carried out in the same manner as described in Synthesis Example 1, (1), to give 75.9 g of poly(p-tert-butoxystyrene/p-chlorostyrene) as white powder having Mw 22000 (GPC with polystyrene calibration). The polymer was found to have p-tert-butoxystyrene unit and p-chlorostyrene unit in a molar ratio) of ca. 95:5 based on $^1$HNMR.
(2) Using poly{p-tert-butoxystyrene/p-chlorostyrene) (61.0 g) obtained in above (1), the reaction and the treatment were carried out in the same manner as described in Synthesis Example 1, (2), to give 36.0 g of poly(p-hydroxystyrene/p-chlorostyrene) as white powder. The polymer was found to have p-hydroxystyrene unit and p-chlorostyrene unit in a molar ratio of ca. 95:5 based on $^1$HNMR.
(3) Using poly(p-hydroxystyrene/p-chlorostyrene) (15.1 g) obtained in above (2) and methyl vinyl ether (2.9 g), the reaction and the treatment were carried out in the same manner as described in Synthesis Example 1, (3), to give 14.1 g of poly[p-(1-methoxyethoxy)styrene/p-hydroxystyrene/p-chlorostyrene] as white powder having Mw 22000 (GPC with polystyrene calibration). The polymer was found to have p-(1-methoxyethoxy)styrene unit, p-hydroxystyrene unit and p-chlorostyrene unit: in a molar ratio of ca. 35:60:5 based on $^1$HNMR.

Synthesis Example 8

Synthesis of poly[p-(1-ethoxyethoxy)styrene/p-hydroxystyrene/p-acetyloxystyrene]
(1) Using p-acetyloxystyrene (32.4 g), the polymerization and the treatment were carried out in the same manner as described in Synthesis Example 3, (1), to give 30.0 g of poly(p-acetyloxystyrene) as white powders having Mw 15000 (GPC with polystyrene calibration).
(2) A solution of poly(p-acetyloxystyrene) (13.8 g) obtained in above (1) and conc. hydrochloric acid (5 ml) in 1,4-dioxane was reacted with stirring for 2 hours at 70°–80° C. After cooling, the reaction mixture was poured into $H_2O$ (1 l) and the polymer was precipitated. The polymer was filtered, washed with $H_2O$ and dried under reduced pressure to give 9.5 g of poly(p-hydroxystyrene/p-acetyloxystyrene) as white powder. The polymer was found to have p-hydroxystyrene unit and p-acetyloxystyrene unit in a molar ratio of ca. 90:10 based on $^1$HNMR.
(3) Using poly(p-hydroxystyrene/p-acetyloxystyrene) (9.5 g) obtained in above (2) and ethyl vinyl ether (2.2 g), the reaction was carried out in the same manner as described in Synthesis Example 3, (3), the precipitate was filtered, washed with $H_2O$ and dried under reduced pressure to give 9.9 g of poly[p-(1-ethoxyethoxy)styrene/p-hydroxystyrene/p-acetyloxystyrene] as white powder having Mw 17500 (GPC with polystyrene calibration). The polymer was found to have p-(1-ethoxyethoxy)styrene unit, p-hydroxystyrene unit and p-acetyloxystyrene unit in a molar ratio of ca. 35:55:10 based on $^1$HNMR.

Synthesis Example 9

Synthesis of poly[p-(1-ethoxyethoxy)styrene/p-hydroxystyrene/p-tetrahydropyranyloxystyrene]
(1) A solution of p-acetyloxystyrene (16.2 g) obtained in Synthesis Example 8, (1) and conc. hydrochloric acid (25 ml) in 1,4-dioxane was reacted with stirring for 4 hours under reflux. After cooling, the reaction mixture was poured into $H_2O$ (1 l) and the polymer was precipitated. The precipitate was filtered, washed with $H_2O$ and dried under reduced pressure to give 11.4 g of poly(p-hydroxystyrene) as white powder.
(2) A solution of poly(p-hydroxystyrene) (10.8 g) obtained in above (1), 2,3-dihydropyran (1.5 g) and pyridinium p-toluenesulfonate (0.05 g) in 1,4-dioxane was reacted with stirring for 15 hours at 25°–30° C. After reaction, the reaction mixture was poured into $H_2O$ (1 l) and the polymer was precipitated. The precipitate was filtered, washed with $H_2O$ and dried under reduced pressure to afford 10.0 g of poly(p-hydroxystyrene/p-tertahydropyranyloxystyrene) as white powder. The polymer was found to have p-hydroxystyrene unit and p-tetrahydropyranyloxystyrene unit in a molar ratio of ca. 92:8 based on $^1$HNMR.
(3) Using poly(p-hydroxystyrene/p-tetrahydropyranyloxystyrene) (9.5 g) obtained in above (2) and ethyl vinyl ether (2.1 g), the reaction was carried out in the same manner as described in Synthesis Example 3, (3), the precipitate was filtered, washed with $H_2O$ and dried under reduced pressure to give 9.9 g of poly[p-( 1-ethoxyethoxy)styrene/p-hydroxystyrene/p-tetrahydropyranyloxystyrene] as white powder having Mw 17000 (GPC with polystyrene calibration). The polymer was found to have p-(1-ethoxyethoxy)styrene unit, p-hydroxystyrene unit and p-tetrahydropyranyloxystyrene unit in a molar ratio of ca. 32:60:8 based on $^1$HNMR.

Synthesis Example 10

Synthesis of poly[p-(1-ethoxyethoxy)styrene/p-hydroxystyrene/p-tert-butoxycarbonyloxystyrene]

(1) A suspension of ply(p-tert-butoxystyrene) (35.3 g) obtained in synthesis Example 3, (1) and conc. hydrochloric acid (50 ml) in iso-propanol was reacted with stirring for 4 hours under reflux. After cooling, the reaction mixture was poured into $H_2O$ (3 l) and the polymer was precipitated. The polymer was filtered, washed with $H_2O$ and dried under reduced pressure to afford 22.1 g of poly(p-hydroxystyrene) as white powder.

(2) To a solution of poly(p-hydroxystyrene) (16.2 g) obtained in above (1) in ethyl acetate (60 ml), di-tert-butyl dicarbonate (3.3 g) and anhydrous potassium carbonate (2.5 g) were added and reacted with stirring for 4 hours at room temperature. After reaction, ethyl acetate was removed in vacuo, the residue was diluted with acetone (80 ml), and then the solution was poured into $H_2O$ (1 l). The resultant precipitate was filtered, washed witch $H_2O$ and dried under reduced pressure to give 12.1 g of poly(p-hydroxystyrene/p-tertbutoxycarbonyloxystyrene) as white powder. The polymer was found to have p-hydroxystyrene unit and p-tert-butoxycarbonyloxystyrene unit in a molar ratio of ca. 91:9 based on $^1HNMR$.

(3) Using poly(p-hydroxystyrene/p-tert-butoxycarbonyloxystyrene) (11.4 g) obtained in above (2) and ethyl vinyl ether (2.5 g), the reaction and the treatment were carried out in the same manner as described in Synthesis Example 1, (3), to give 6.8 g of ply[p-(1-ethoxyethoxy)styrene/p-hydroxystyrene/p-tert-bugtoxycarbonyloxystyrene] as white powder having Mw 21500 (GPC with polystyrene calibration). The polymer was found to have p-(1-ethoxyethoxy)styrene unit, p-hydroxystyrene unit and p-tert-butoxycarbonyloxystyrene unit in a molar ratio of ca. 30:61:9 based on $^1HNMR$.

Synthesis Example 11

Synthesis of poly[p-(1-methoxyethoxy)styrene/p-hydroxystyrene/tert-butyl p-vinylphenoxyacetate]

(1) A suspension of poly(p-hydroxystyrene) (16.2 g) obtained in Synthesis Example 10, (1), tert-butyl monochloroacetate (3.0 g) and anhydrous potassium carbonate (2.8 g) in acetone (200 ml) was reacted with stirring for 2 hours under reflux. After cooling, the inorganic precipitate was filtered off, the filtrate was poured into $H_2O$ (3 l) and the polymer was precipitated. The precipitate was filtered, washed with $H_2O$ and dried under reduced pressure to give 15.8 g of poly(p-hydroxystyrene/tert-butyl p-vinylphenoxyacetate) as white powder. The polymer was found to have p-hydroxystyrene unit and tert-butyl p-vinylphenoxyacetate unit in a molar ratio of ca. 90:10 based on $^1HNMR$.

(2) Using poly(p-hydroxystyrene/tert-butyl p-vinylphenoxyacetate) (13.2 g) obtained in above (1) and methyl vinyl ether (2.0 g), the reaction and the treatment were carried out in the same manner as described in Synthesis Example 1, (3), to give 10.6 g of poly[p-(1-methoxyethoxy)styrene/p-hydroxystyrene/tert-butyl p-vinylphenoxyacetate] as white powder having Mw 21000 (GPC with polystyrene calibration). The polymer was found to have p-(1-methoxyethoxy)styrene unit, p-hydroxystyrene unit and tert-butyl p-vinylphenoxyacetate unit in a molar ratio of ca. 35:55:10 based on $^1HNMR$.

Synthesis Example 12

Synthesis of 1,2,3-tris(trifluoromethane-sulfonyloxy)benzene

To a suspension of 1,2,3-benzenetriol (1.01 g, 8.01 mmole) and γ-collidine (4.14 g, 32.3 mmole) in methylene chloride (60 ml), trifluoromethanesulfonic anhydride (8.13 g, 28.8 mmole) was added dropwise at −3°–0° C. and stirring was continued for 6 hours at the same temperature. After reaction, $H_2O$ (50 ml) and toluene (50 ml) were added to the mixture with stirring and standed. The organic layer was separated, washed with 5% sodium hydroxide aqueous solution (50 ml) then $H_2O$ (50 ml), dried over anhydrous $MgSO_4$ and evaporated. The residue was chromatographed on silica gel (Wakogel C-200, manufactured by Wako pure Chemical Industries, Ltd.) with n-hexane/ethyl acetate [1/20 (v/v)] as eluent to give 1.82 g of 1,2,3-tris(trifluoromethanesulfonyloxy)benzene as white crystals. m.p. 47.5°–48.5° C.

$^1HNMR$ δ ppm ($CDCl_3$): 7.59 (3H, s, Aromatic).

IR (KBr-disk) $vcm^{-1}$: 3116, 1137.

Synthesis Example 13

Synthesis of 2,3,4-tris(trifluoromethane-sulfonyloxy)acetophenone

Using 2,3,4-trihydroxyacetophenone (1.68 g, 10 mmole) and trifluoromethanesulfonic anhydride (9.88 g, 35 mmole), the reaction and the treatment were carried out in the same manner as described in Synthesis Example 12, the resultant crude yellow oil (5.3 g) was chromatographed on silica gel (Wakogel C-200) with n-hexane/methylene chloride (2/1) as eluent to give 2.77 g of 2,3,4-tris(trifluoromethanesulfonyloxy)acetophenone as white crystals. m.p. 74.8°–76.4° C.

$^1HNMR$ δ ppm ($CDCl_3$): 2.68 (3H, s, $CH_3$), 7.67 (1H, d, J=8.8 Hz), 7.89 (1H, d, J=8.8 Hz).

IR (KBr-disk) $vcm^{-1}$: 3403, 3108, 2937, 1715, 1607, 1363 ($SO_2$), 1123 ($SO_2$).

Synthesis Example 14

Synthesis of 2,2',4,4'-tetra(trifluoromethanesulfonyloxy)benzophenone

Using 2,2',4,4'-tetrahydroxybenzophenone (2.46 g, 10 mmole) and trifluoromethanesulfonic anhydride (13.3 g, 47 mmole), the reaction and the treatment were carried out in the same manner as described in Synthesis Example 12, the resultant crude yellow oil (7.7 g) was chromatographed on silica gel (Wakogel C-200) with n-hexane/methylene chloride [7/3 (v/v)] as eluent to give 2.1 g of 2,2',4,4'-tetra(trifluoromethanesulfonyloxy)benzophenone as pale yellow crystals. m.p. 94.0°–96.0° C.

$^1HNMR$ δ ppm ($CDCl_3$): 7.35 (2H, d, J=2.20 Hz, Aromatic), 7.51 (2H, dd, J=2.20 Hz and J=8.43 Hz, Aromatic), 7.88 (2H, d, J=8.43 Hz, Aromatic).

IR (KBr-disk) $vcm^{-1}$: 3091, 1683, 1609, 1138 ($SO_2$).

Synthesis Example 15

Synthesis of 1,2,3-tris(2,2,2-trifluoroethane-sulfonyloxy)benzene

To a suspension of 1,2,3-benzenetriol (2.30 g, 18 mmole) and triethylamine (6.53 g, 64.5 mmole) in methylene chloride (80 ml), 2,2,2-trifluoroethanesulfonyl chloride (11.65 g, 64 mmole) was added dropwise at −5°–0° C., continued to stir for 2 hours at the same temperature and standed at room temperature overnight. The reaction mixture was poured into cold $H_2O$ (120 ml), extracted with methylene chloride (80 ml), the organic layer was washed with saturated sodium bicarbonate aqueous solution (80 ml×1), then H$_2$O (80 ml×1), dried over anhydrous Mg SO$_4$ and evaporated. The residual oil (8.3 g) was chromatographed on silica gel (Wakogel C-200, manufactured by Wako Pure Chemical Industries, Ltd.) with n-hexane/ethyl acetate [8/1 (v/v)] as eluent and recrystallized from n-hexane/methylene chloride [2/1 (v/v)] to give 1.2 g of 1,2,3-tris(2,2,2-trifluoroethane-sulfonyloxy)benzene as white leaflets. m.p. 73.5°–75.0° C.

$^1$HNMR δ ppm (DMSO-d$_6$): 5.23–5.50 (6H, m, CH$_2$ x 3), 7.65–7.76 (3H, m, Aromatic).

IR (KBr-disk) vcm$^{-1}$: 3022, 2968, 1334 (SO$_2$), 1156 (SO$_2$).

Synthesis Example 16

Synthesis of 2,3,4-tris(2,5-dichlorobenzenesulfonyloxy)acetophenone

To a solution of 2,3,4-trihydroxyacetophenone (1.18 g, 7 mmole) and triethylamine (2.02 g, 20 mmole) in methylene chloride (20 ml), a solution of 2,5-dichlorobenzenesulfonyl chloride (4.90 g, 20 mmole) in methylene chloride (20 ml) was added dropwise at 0°–2° C. and reacted with stirring for 1 hour at the same temperature. The reaction mixture was poured into ice-cold H$_2$O (100 ml), extracted with methylene chloride (100 ml×2), the organic layer was washed with H$_2$O (100 ml×2), dried over anhydrous MgSO$_4$ and evaporated. The residue (7.3 g) was recrystallized from methanol to give 3.0 g of 2,3,4-tris(2,5-dichlorobenzenesulfonyloxy)acetophenone as white crystals. m.p. 165.0°–166.5° C.

$^1$HNMR δ ppm (DMSO-d$_6$): 3.43 (3H, s, CH$_3$CO), 7.46 (1H, d, J=9 Hz Aromatic), 7.64 (1H, d, J=8 Hz, Aromatic), 7.79–7.98 (9H, m, Aromatic)

IR (KBr-disk) vcm$^{-1}$: 1730 (C=O), 1190 (SO$_2$)

Synthesis Example 17

Synthesis of diphenyl-p-tolylsulfonium perfluorooctanesulfonate

To a solution of diphenylsulfoxide (2.02 g, 10 mmole) in toluene (30 ml), trifluoroacetic anhydride (4.2 g, 20 mmole) was added dropwise at 10° C. or below, then perfluorooctanesulfonic acid (5.0 g, 10 mmole) was added to the mixture, reacted with stirring for 1 hour at 10° C. or below, and then for 2 hours at room temperature. After standing, the oily layer was separated, washed with toluene (30 ml×2) and with n-hexane (30 ml×3) to afford 7.4 g of diphenyl-p-tolylsulfonium perfluorooctanesulfonate as yellow viscous oil.

$^1$HNMR δ ppm (CDCl$_3$): 2.44 (3H, s, CH$_3$), 7.46 (2H, d, J=8 Hz, Aromatic), 7.60 (2H, d, J=8 Hz, Aromatic), 7.65–7.73 (10H, m, Aromatic).

Synthesis Example 18

Synthesis of triphenylsulfonium p-toluenesulfonate
(1) To a suspension of magnesium turning (12 g) in ethyl ether (500 ml), bromobenzene (83.5 g, 0.54 mole) was added dropwise under reflux with stirring and continued to stir for 1 hour under reflux. to this Grignard reagent, benzene (500 ml) was added and concentrated until 500 ml. To this resultant mixture, a solution of diphenylsulfoxide (30 g, 0.15 mole) in benzene (200 ml) was added and reacted with stirring for 40 hours under reflux. After the reaction mixture was cooled to 0° C., 40% tetrafluoroboric acid (50 ml) was added dropwise at 0°–5° C. and reacted with stirring for 5 hours at the same temperature. After standing at room temperature overnight, the aqueous layer separated was extracted with methylene chloride (100 ml×3), the organic layer was washed with H$_2$O, dried over anhydrous sodium sulfate and dried. The residual crude solid was recrystallized from chloroform/ethyl ether to give 28 g of triphenylsulfonium tetrafluoroborate as white crystals. m.p. 291°–292° C.

(2) To a solution of triphenylsulfonium tetrafluoroborate (1.0 g, 3 mmole) obtained in above (1) in ethanol (180 ml), a solution of sodium p-toluenesulfonate (0.58 g, 3 mmole) in H$_2$O (20 ml) was added with vigorous stirring at room temperature and continued to stir for 2 hours at room temperature. After standing at room temperature overnight, the precipitate was filtered off, the filtrate was concentrated under reduced pressure and the residue was recrystallized from methanol/ethyl ether to give 1.15 g of triphenylsulfonium p-toluenesulfonate as white needles. m.p. 100°–102° C.

Synthesis Example 19

Synthesis of triphenylsulfonium 10-camphor-sulfonate

To a solution of triphenylsulfonium tetrafluoroborate (1.0 g, 3 mmole) obtained in Synthesis Example 18, (1) in acetone (50 ml), a solution of potassium 10-camphorsulfonate (0.80 g, 3 mmole) in H$_2$O (10 ml) was added with vigorous stirring at room temperature and continued to stir for 1 hour at room temperature. After standing at room temperature overnight, the precipitate was filtered off, the filtrate was concentrated under reduced pressure and the residue was recrystallized from methanol/ethyl ether to afford 1.20 g of triphenylsulfonium 10-camphorsulfonate as white needles having a melting point of 66° C. (dec.).

Reference Example 1

Synthesis of poly(p-1-ethoxyethoxystyrene/p-hydroxystyrene)

(1) A solution of p-tert-butoxystyrene (17.6 g) in toluene containing catalytic amount of 2,2'-azobisisobutyronitrile was polymerized at 80° C. for 6 hours under nitrogen. After cooling, the reaction mixture was poured into methanol (1 l) and the polymer was precipitated. The polymer was filtered, washed with methanol and dried under reduced pressure to afford 16.8 g of poly(p-tert-butoxystyrene) as white powder having Mw 10000 (GPC with polystyrene calibration).

(2) A solution of poly(p-tert-butoxystyrene) (15.0 g) obtained in above (1) and conc. hydrochloric acid (10 ml) in 1,4-dioxane was refluxed for 4 hours with stirring. The mixture was cooled, poured into H$_2$O (1 l) and the solid was precipitated. The polymer was filtered, washed with H$_2$O and dried under reduced pressure to give 9.7 g of poly(p-hydroxystyrene) as white powder.

(3) To a solution of poly(p-hydroxystyrene) (4.0 g) obtained in above (2) and ethyl vinyl ether (1.2 g) in a mixed solvent (35 ml) of 1,4-dioxane and pyridine, a catalytic amount of p-toluenesulfonic acid was added and reacted with stirring at room temperature for 24 hours. The reaction mixture was poured into H$_2$O (1 l) and a white solid was precipitated. The polymer was filtered, washed with h$_2$O and dried under reduced pressure to afford 5.0 g of poly[p-(1-ethoxyethoxy)-styrene/p-hydroxystyrene] as white powder having Mw 10000 (GPC with polystyrene calibration). The polymer was found to have p-(1-ethoxyethoxy)styrene unit and p-hydroxystyrene unit in a molar ratio of ca. 4:6 based on $^1$HNMR.

Reference Example 2

Synthesis of poly(p-tetrahydropyranyloxystyrene/p-hydroxystyrene)

To a solution of poly(p-hydroxystyrene) (9.0 g) obtained in Reference Example 1, (2) in 1,2-dimethoxyethane (100 ml) 2,3-dihydroxypyran (12.6 g) and sulfuric acid (0.5 ml) were added, followed by reaction at 30°–40° C. for 15 hours with stirring. After reaction, the mixture was evaporated in vacuo, the residue was neutralized by addition of sodium carbonate and poured into $H_2O$ (1 l) to precipitate a polymer. The polymer was filtered by suction, washed with $H_2O$ and dried under reduced pressure to give 11.0 g of poly(p-tetrahydropyranyloxystyrene/p-hydroxystyrene) as white powder having Mw 10000 (GPC with polystyrene calibration). The polymer was found to have p-tetrahydropyranyloxystyrene unit and p-hydroxy styrene unit in a molar ratio of ca. 3:7 based on $^1$HNMR.

Reference Example 3

Synthesis of poly(p-tert-butoxycarbonyloxy-styrene/p-hydroxystyrene)

(1) A solution of p-tert-butoxycarbonyloxystyrene (22 g, 0.1 mole) obtained by the method of U.S. Pat. No. 4,491,628 (1985) in toluene containing catalytic amount of 2,2'-azobis(2,4-dimethylvaleronitrile) was polymerized at 90° C. for 4 hours under nitrogen. After cooling, the reaction mixture was poured into methanol and the polymer was precipitated. The polymer was filtered, washed with methanol and dried under reduced pressure to give 15.2 g of poly(p-tert-butoxycarbonyloxystyrene) as white powder having Mw 12000 (GPC with polystyrene calibration).

(2) To a solution of poly (p-tert-butoxycarbonyloxystyrene) (7.0 g) obtained in above (1) in 1,4-dioxane, conc. hydrochloric acid (5 ml) was added and continued to stir under reflux for 2 hours. After cooling, the reaction mixture was poured into $H_2O$ (1 l) and the polymer was precipitated. The polymer was filtered by suction, washed with $H_2O$ and dried under reduced pressure to give 4.8 g of poly(p-tert-butoxycarbonyloxystyrene/p-hydroxystyrene) as white powder having Mw 10000 (GPC with polystyrene calibration). The polymer was found to have p-tertbutoxycarbonyloxystyrene unit and p-hydroxystyrene unit in a molar ratio of ca. 4:6 based on $^1$HNMR.

Reference Example 4

Synthesis of poly(p-tert-butoxystyrene/p-hydroxystyrene)

A solution of poly(p-tert-butoxystyrene) (15.0 g) obtained in Reference Example 1, (1) and conc. hydrochloric acid (10 ml) in 1,4-dioxane was reacted for 3 hours at 80°–85° C. with stirring. After reaction, the reaction mixture was poured into $H_2O$ and the polymer was precipitated. The polymer was filtered by suction, washed with $H_2O$ and dried under reduced pressure to give 9.8 g of poly(p-tert-butoxystyrene/p-hydroxystyrene) as white powder having Mw 9000 (GPC with polystyrene calibration). The polymer was found to have p-tert-butoxystyrene unit and p-hydroxystyrene unit in a molar ratio of ca. 35:65 based on $^1$HNMR.

Reference Example 5

Synthesis of 9-diazo-10-phenanthrone

A suspension of 9,10-phenanthrenequinone (2.08 g, 20 mmole) and p-toluenesulfonylhydrazide (1.80 g, 19 mmole) in ethanol (20 ml) was refluxed for 10 minutes with stirring. After cooling, the precipitate was filtered and recrystallized from cyclohexane/petroleum ether to give 1.1 g of 9-diazo-10-phenan throne as yellow needles having a m.p. 107°–109° C.

IR (KBr-disk) $vcm^{-1}$: 2106 ($CN_2$), 1615 (C=O).

Reference Example 6

Synthesis of 1-diazo-2-tetralone

To a solution of sodium ethoxide (20.0 g, 0.20 mole) in ethanol (600 ml), a solution of 2-tetralone (42.4 g, 0.29 mole) in ethanol (100 ml) was added dropwise at 0° C. with stirring, then p-toluenesulfonylazide (59.2 g, 0.3 mole) was added dropwise at −15° C. or below to the mixture and reacted with stirring for 3 hours at −10° to 0° C. The reaction mixture was poured into $H_2O$ (1 l), extracted with methylene chloride (500 ml×2), the organic layer separated was washed with $H_2O$ (500 ml×3), dried over anhydrous $MgSO_4$ and evaporated. The oily residue (72 g) was chromatographed on silica gel (Wakogel C-200) with n-hexane-n-hexane/methylene chloride (1/1) as eluent and recrystallized from n-hexane to afford 6.0 g of 1-diazo-2-tetralone as yellow crystals. m.p. 42.5°–44.2° C.

$^1$HNMR δ ppm ($CDCl_3$): 2.66 (2H, t, J=7 Hz), 3.02 (2H, t, J=7 Hz), 6.98 (1H, d, J=8 Hz), 7.10 (1H, t, J=8 Hz), 7.21–7.29 (2H, m)

IR (Neat) $vcm^{-1}$: 2080 ($CN_2$)

Reference Example 7

Synthesis of 2-diazo-1-tetralone (1) A solution of α-tetralone (4.4 g, 30 mmole) in ethanol (30 ml) was cooled to 10° C., 90% potassium tert-butoxide (4.5 g, 36 mmole) was added to a solution and continued to stir for 30 minutes at 10° C. Then isoamyl nitrite (3.5 g, 30 mmole) was added dropwise at 10° C. to the solution and reacted with stirring for 5 hours at the same temperature. The reaction mixture was poured into $H_2O$, neutralized with conc. hydrochloric acid, extracted with methylene chloride, the organic layer was separated and evaporated. The residual dark-brownish oil (6.7 g) was crystallized from n-hexane, the crystals was filtered and dried to give 2.3 g of 2-oxyimino-1-tetralone as dark-brown crystals.

$^1$HNMR δ ppm ($CDCl_3$): 3.07 (2H, t, J=6 Hz), 3.18 (2H, t, J=6 Hz), 7.30 (1H, d, J=8 Hz), 7.38 (1H, t, J=8 Hz), 7.54 (1H, t, J=8 Hz), 8.12 (1H, d, J=8 Hz).

(2) A suspension of 2-oxyimino-1-tetralone (1.2 g, 7 mmole) obtained in above (1) and sodium hydroxide (0.4 g, 10 mmole) in $H_2O$ (10 ml), 25% ammonia water (4 ml) was added dropwise at 10° C. or below, then hypochlorous acid (30 ml) was added dropwise to the mixture at 10° C. or below and reacted with stirring for 1 hour at 10° C. After reaction, the precipitate was filtered, washed witch $H_2O$ and dried. The resultant solid (0.90 g) was dissolved in methylene chloride, treated with active carbon, evaporated and the residue was recrystallized from n-hexane to give 0.55 g of 2-diazo-1-tetralone as yellow crystals. m.p. 50.0°–52.0° C.

$^1$HNMR δppm ($CDCl_3$): 3.01 (4H, m), 7.21 (1H, d, J=7 Hz), 7.36 (1H, t, J=7 Hz), 7.42 (1H, t, J=7 Hz), 8.01 (1H, d, J=8 Hz).

IR (KBr-disk) $vcm^{-1}$: 2073 ($CN_2$), 1629 (C=O).

Reference Example 8

Synthesis of 9-diazofluorenone (1) To a suspension of p-toluenesulfonylhydrazide (3.7 g, 20 mmole) in ethanol (60 ml), 9-fluorenone (3.6 g, 20 mmole) was added and reacted for 6 hours under reflux. After cooling, the precipitate was filtered and dried to give 5.4 g of 9-fluorenone p-toluenesulfonylhydrazide as pale yellow needles. m.p. 173°–174° C.

IR (KBr-disk) vcm$^{-1}$: 3212, 3065, 1909, 1597, 1453, 1407, 1337, 1315.

(2) A suspension of 9-fluorenone p-toluene-sulfonylhydrazide (1.7 g, 5 mmole) obtained in above (1) and sodium ethoxide (0.3 g, 5 mmole) in pyridine (20 ml) was reacted with stirring for 6 hours at 60°–65° C. The reaction mixture was poured into ice-cold H$_2$O (100 ml), extracted with methylene chloride and the organic layer separated was evaporated. The residual brown oil was chromatographed on silica gel (Wakogel C-200, manufactured by Wako Pure Chemical Industries, Ltd.) with ethyl acetate/n-hexane (1/10) as eluent to give 0.6 g of 9-diazofluorenone as orange yellow needles. m.p. 98.5°–99.5° C.

$^1$HNMR δppm (CDCl$_3$): 7.32 (2H, t, J=8 Hz), 7.39 (2H, t, J=8 Hz), 7.51 (2H, d, J=8 Hz), 7.94 (2H, d, J=8 Hz).

IR (KBr-disk) vcm$^{-1}$: 2087 (CN$_2$)

Synthesis Example 9

Synthesis of 9-(2-methoxyethoxy)methylanthracene

To a solution of 2-methoxyethanol (1 l) in benzene (1.5 l), conc. sulfuric acid (3 ml) was added and the mixture was heated to 80° C. A solution of 9-anthracenemethanol (45 g, 0.22 mole) in 2-methoxyethanol (450 ml) was added to the mixture under reflux and stirring was continued for 1.5 hours under reflux. After standing at room temperature overnight, the reaction mixture was washed with saturated aqueous sodium bicarbonate, dried over anhydrous MgSO$_4$ and evaporated. The residual crude oil (63 g) was chromatographed on silica gel (Wakogel C-200, manufactured by Wako Pure Chemical Industries, Ltd.) with n-hexane/ethyl acetate [50/1→25/1→8/1 (V/V)] as eluent to give 47.6 g of 9-(2-methoxyethoxy)methylanthracene as orange yellow oil.

$^1$HNMR δppm (CDCl$_3$): 3.37 (3H, s, CH$_2$O), 3.53–3.57 (2H, t, CH$_3$, O—CH$_2$—), 3.73–3.77 (2H, t, CH$_3$O—CH$_2$CH$_2$O), 5.55 (2H, s, Ar—CH$_2$O—), 7.43–7.56 (4H, m, Aromatic 2-H, 3-H, 6-H, 7-H), 7.99 (2H, d, J=9 Hz, Aromatic 4-H, 5-H), 8.42 (2H, d, J=9 Hz, Aromatic 1-H, 8-H), 8.44 (1H, s, Aromatic 10-H).

IR (Neat) vcm$^{-1}$: 1130.

Reference Example 10

Synthesis of poly(tert-butyl p-vinylphenoxy-acetate/p-hydroxystyrene)

A suspension of poly(p-hydroxystyrene) (4.0 g) obtained in the same manner as described in Reference Example 1, (2), tert-butyl monochloroacetate (3.0 g) and anhydrous K$_2$CO$_3$ (2.8 g) in acetone (35 ml) was reacted with stirring for 2 hours under reflux. After cooling, the precipitate was filtered off, the filtrate was poured into H$_2$O (1 l) and was precipitated. The precipitate was filtered, washed with H$_2$O and dried under reduced pressure to give 5.2 g of poly(tert-butyl p-vinylphenoxyacetate/p-hydroxystyrene) as white powder having Mw 11000 (GPC with polystyrene calibration). The polymer was found to have tert-butyl p-vinylphenoxyacetate unit and p-hydroxystyrene unit in a molar ratio of ca. 1:1 based on $^1$HNMR.

Reference Example 11

Synthesis of poly[p-(1-ethoxyethoxy)styrene/p-hydroxystyrene/fumaronitrile]

(1) A solution of p-tert-butoxystyrene (28.2 g, 0.16 mole) and fumaronitrile (3.1 g, 0.04 mole) in toluene containing catalytic amount of 2,2'-azobis(methyl 2-methylpropionate) was polymerized at 90° C. for 2 hours under nitrogen. After cooling, the reaction mixture was poured into methanol and the polymer was precipitated. The polymer was filtered, washed with methanol and dried under reduced pressure to afford 21.3 g of poly(p-tert-butoxystyrene/fumaronitrile) as white powder.

(2) Using poly(p-tert-butoxystyrene/fumaronitrile) (20.0 g) obtained in above (1), the reaction and the treatment were carried out in the same manner as described in Reference Example 1, (2) to give 10.6 g of poly(p-hydroxystyrene/fumaronitrile) as white powder having Mw 10000 (GPC with polystyrene calibration).

(3) Using poly(p-hydroxystyrene/fumaronitrile) (9.0 g) and ethyl vinyl ether (3.0 g), the reaction and the treatment were carried out in the same manner as described in Reference Example 1, (3) to afford 8.8 g of poly[p-(1-ethoxyethoxy)styrene/p-hydroxystyrene/fumaronitrile] as white powder having Mw 11000 (GPC with polystyrene calibration). The polymer was found to have p-(1-ethoxyethoxy)styrene unit and p-hydroxystyrene unit in a molar ratio of ca. 4:6 based on $^1$HNMR.

Reference Example 12

Synthesis of poly[p-(1-methoxyethoxy)styrene/p-hydroxystyrene]

Using poly(p-hydroxystyrene) (4.0 g) obtained in the same manner as described in Reference Example 1, (2) and methyl vinyl ether (4.0 g), the reaction and the treatment were carried out in the same manner as described in Reference Example 1, (3) to give 5.3 g of poly[p-(1-methoxyethoxy)styrene/p-hydroxystyrene] as white powder having Mw 10000 (GPC with polystyrene calibration). The polymer was found to have p-(1-methoxyethoxy)styrene unit and p-hydroxystyrene unit in a molar ratio of ca. 92:8 based on $^1$HNMR.

Reference Example 13

Synthesis of N-trifluoromethanesulfonyloxy-bicyclo[2,2,1]-hept-5-ene-2,3-dicarboximide To a solution of trifluoromethanesulfonic anhydride (6.5 g, 23 mmole) in methylene chloride (20 ml), a solution of N-hydroxy-bicyclo[2,2,1]-hept-5-ene- 2,3-dicarboximide (3.6 g, 20 mmole) and pyridine (1.6 g) in methylene chloride (10 ml) was added dropwise at 0°–5° C. and continued to stir for 15 minutes at the same temperature. The reaction mixture was washed with H$_2$O (20 ml×3), dried over anhydrous Mg SO$_4$ and evaporated. The residue was recrystallized from ethanol to give 6.1 g of N-trifluoromethanesulfonyloxy-bicyclo[2,2,1]-hept-5-ene-2,3-dicarboximide as white needles. m.p. 89°–90° C.

$^1$HNMR δppm (CDCl$_3$): 1.52 (1H, d, J=9 Hz), 1.79 (1H, d, J=9 Hz), 3.36 (2H, s), 3.48 (2H, s), 6.16 (2H, s).

IR (KBr-disk) vcm$^{-1}$: 1757 (C=O), 1159 (SO$_2$).

Reference Example 14

Synthesis of dimethylphenylsulfonium trifluoro-methanesulfonate

To a solution of thioanisole (2.48 g, 20 mmole) in methylene chloride (20 ml), methyl trifluoromethanesulfonate (3.28 g, 20 mmole) was added dropwise at 10° C. or below, and the mixture was refluxed for 2 hours with stirring. After cooling, the reaction solution was poured into n-hexane (75 ml), and the precipitate was filtered, washed with n-hexane and dried. The resultant crude solid (5.35 g) was recrystallized from iso-propanol to give 4.8 g of dimethylphenylsulfonium trifluoromethanesulfonate as white leaflets. m.p. 106.0°–107.2° C.

$^1$HNMR δppm (CDCl$_3$): 3.00 (6H, s, CH$_3$x2), 7.32 (2H, t, J=7 Hz), 7.42 (1H, t, J=7 Hz), 7.68 (2H, d, J=7 Hz).

IR (KBr-disk) νcm$^{-1}$: 3023, 2947, 1451, 1426, 1254, 1228, 1154.

Example 1

A photoresist material of the following composition was prepared:

| | |
|---|---|
| Poly(p-1-ethoxyethoxystyrene/p-hydroxystyrene/p-tert-butoxystyrene [Polymer of Synthesis Example 3] | 5.0 g |
| Bis(cyclohexylsulfonyl)diazomethane | 0.3 g |
| Propylene glycol monomethyl ether acetate | 19.7 g |

The above resist material was spin coated on each of the three substrates (silicon wafers) and prebaked on a hot plate at 90° C. for 90 seconds to form a 1.0 μm thick resist film. Then the whole wafer surface was exposed by a contact exposure machine (provided with a band pass filter allowing selective passage of light with a wavelength of around 250 nm alone) for 30 seconds, 60 seconds and 90 seconds for the respective substrates, followed by postbaking on a 0° C. hot plate for 90 seconds. $^1$HNMR analysis identified the polymer in each of the exposed resist films as a copolymer having p-hydroxystyrene unit and p-tert-butoxystyrene unit in a ratio of approximately 9:1, with no p-1-ethoxyethoxystyrene unit detected. It was thus confirmed that 1-ethoxyethoxy group alone was selectively eliminated by the chemical amplifying action of the exposure-generated acid, with p-tert-butyl group undergoing no chemical amplification.

Example 2

A photoresist material of the following composition was prepared:

| | |
|---|---|
| Poly(p-1-ethoxyethoxystyrene/p-hydroxystyrene/styrene) [Polymer of Synthesis Example 2] | 5.0 g |
| Bis(1,1-dimethylethylsulfonyl)diazomethane | 0.3 g |
| Propylene glycol monomethyl ether acetate | 14.7 g |

Figure 1B:
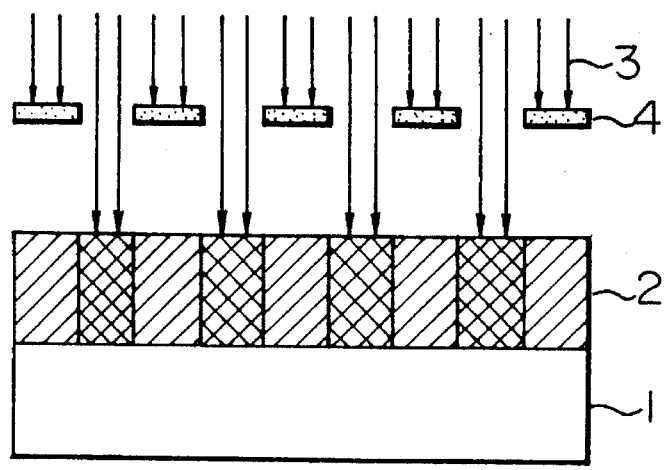
Figure 1C:
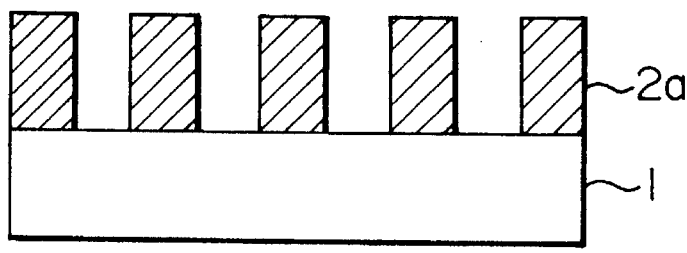

A pattern forming process using the above resist material is explained with reference to FIGS. 1A–1C. Above resist material 2 was spin coated on a semiconductor substrate 1 and prebaked on a hot plate at 90° C. for 90 seconds to form a 1.0 μm thick resist film (FIG. 1A). This resist film was selectively exposed to 248.4 nm KrF excimer laser (NA 0.50) light 3 through a mask 4 (FIG. 1B). The exposed resist film was postbaked on a 100° C. hot plate for 90 seconds and then developed with an alkaline developing solution (2.38% tetramethylammonium hydroxide solution) for 60 seconds, whereby the exposed portion alone of the resist film was dissolved away to form a positive pattern 2a (FIG. 1C). The thus obtained positive pattern had a rectangular shape and showed a 0.22 μm line and space resolving performance. Exposure dose in the above process was approximately 18 mJ/cm$^2$.

Change of pattern size with time during the period from exposure till heat treatment (post-exposure-baking) was measured. 0.22 μm line and space could be resolved quite normally even after the lapse of 8 hours from exposure.

Figure 2:
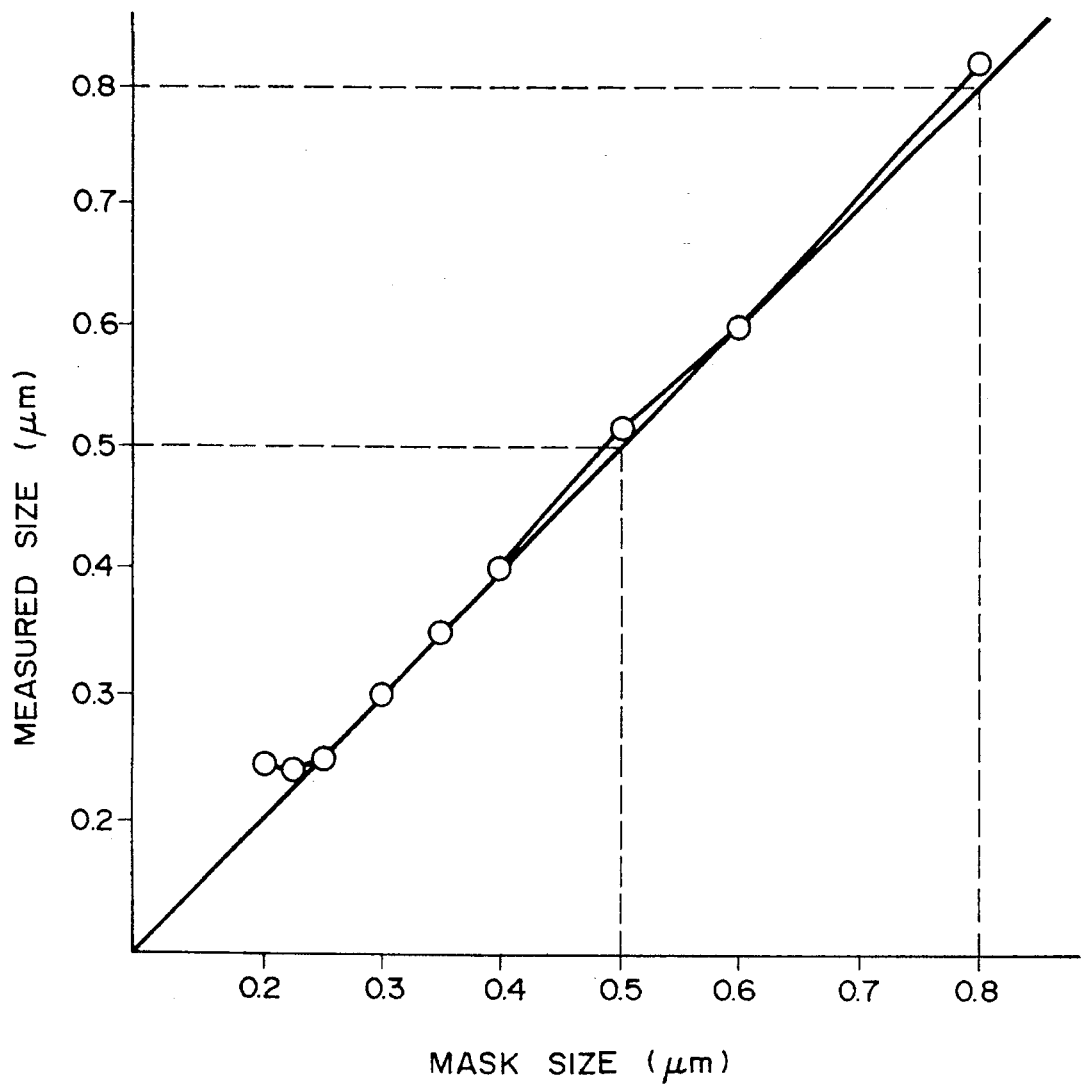
FIG. 2 is a favorable mask linearity (mask fidelity) curve of the resist material obtained in Example 2.

Also, in case the resist material of the present invention was used, good mask linearity was maintained up to 0.25 μm as shown in FIG. 2. In the case of defocus exposure, no deterioration of shape occurred till ±0.8 μm for the 0.3 μm line and space, and a satisfactory focus margin could be obtained. The pattern side wall was also smooth and no scum was observed.

When the same pattern forming operation as described above was conducted after keeping the resist material in storage at 23° C. for one month, a 0.22 μm line-and-space positive pattern could be resolved at the same exposure energy, indicating good storage stability of this resist material.

Examples 3–16

Photoresist materials of the compositions shown in Tables 1–4 were prepared.

TABLE 1

| | | |
|---|---|---|
| Example 3 | Poly(p-1-ethoxyethoxystyrene/p-hydroxystyrene/p-methylstyrene) [Polymer of Synthesis Example 1] | 5.0 g |
| | 1-Acetyl-1-(1-methylethylsulfonyl)-diazomethane | 0.6 g |
| | Propylene glycol monomethyl ether acetate | 14.4 g |
| Example 4 | Poly(p-1-methoxy-1-methylethoxystyrene/p-hydroxystyrene/p-tert-butoxystyrene [Polymer of Synthesis Example 4] | 5.0 g |
| | Bis(1-methylsulfonyl)-diazomethane | 0.6 g |
| | Propylene glycol monomethyl ether acetate | 14.4 g |
| Example 5 | Poly(p-1-ethoxyethoxystyrene/p-hydroxystyrene/p-methoxystyrene) [Polymer of Synthesis Example 5] | 5.0 g |
| | Bis(1,1-dimethylethylsulfonyl)diazomethane | 0.6 g |
| | Propylene glycol monomethyl ether acetate | 14.4 g |
| Example 6 | Poly)p-1-benzyloxy-1-methylethoxystyrene/p-hydroxystyrene/p-tert-butoxystyrene [Polymer of Synthesis Example 6] | 5.0 g |
| | 1-Diazo-1-methylsulfonyl-4-phenylbutane-2-one | 0.7 g |
| | Methyl 3-methoxypropionate | 17.3 g |

TABLE 2

| | | |
|---|---|---|
| Example 7 | Poly(p-1-ethoxyethoxystyrene/p-hydroxystyrene/p-tert-butoxystyrene) | 5.0 g |
| | Bis(cyclohexylsulfonyl)diazomethane | 0.5 g |
| | 9-Diazo-10-phenanthrone [Ultraviolet absorbent of Reference Example 5] | 0.1 g |
| | Propylene glycol monomethyl ether | 14.4 g |

TABLE 2-continued

| | | |
|---|---|---|
| | acetate | |
| Example 8 | Poly(p-1-ethoxyethoxystyrene/p-hydroxystyrene/styrene) | 5.0 g |
| | 1-Diazo-1-cyclohexylsulfonyl-3,3-dimethyl-2-butanone | 0.7 g |
| | 1-Diazo-2-tetralone [Ultraviolet absorbent of Reference Example 6] | 0.1 g |
| | Ethyl lactate | 17.2 g |
| Example 9 | Poly(p-1-methoxy-1-methylethoxystyrene/p-hydroxystyrene/p-tert-butoxystyrene) | 5.0 g |
| | Bis(cyclohexylsulfonyl)-dioazomethane | 0.7 g |
| | 2-Diazo-1-tetralone [Ultraviolet absorbent of Reference Example 7] | 0.1 g |
| | propylene glycol monomethyl ether acetate | 14.2 g |

TABLE 3

| | | |
|---|---|---|
| Example 10 | Poly(p-1-methoxyethoxystyrene/p-hydroxystyrene/p-chlorostyrene) [Polymer of Synthesis Example 7] | 5.0 g |
| | 1-Diazo-1-methylsulfonyl-4-phenylbutan-2-one | 0.6 g |
| | Propylene glycol monomethyl ether acetate | 15.4 g |
| Example 11 | Poly(p-1-ethoxyethoxystyrene/p-hydroxystyrene/p-methoxystyrene) | 5.0 g |
| | Bis(1,1-dimethylethylsulfonyl)-diazomethane | 0.5 g |
| | 1-Diazofluorene [Ultraviolet absorbent of Reference Example 8] | 0.1 g |
| | Methyl 3-methxypropionate | 17.4 g |
| Example 12 | Poly(p-1-ethoxyethoxystyrene/p-hydroxystyrene/p-tert-butoxystyrene | 5.0 g |
| | Bis(cyclohexylsulfonyl)diazomethane | 0.7 g |
| | 9-(2-Methoxyethoxy)methylanthracene [Ultraviolet absorbent of Reference Example 9] | 0.1 g |
| | Propylene glycol monomethyl ether acetate | 14.2 g |
| Examnple 13 | Poly(p-1-ethoxyethoxystyrene/p-hydroxystyrene/styrene) | 5.0 g |
| | 1-Acetyl-1-(1-methylethylsulfonyl)-diazomethane | 0.6 g |
| | 9-Diazo-10-phenanthrone | 0.1 g |
| | Ethyl lactate | 17.3 g |

TABLE 4

| | | |
|---|---|---|
| Example 14 | Poly(p-1-ethoxyethoxystyrene/p-hydroxystyrene/p-methylstyrene) | 5.0 g |
| | Bis(1,1-dimethylethylsulfonyl)-diazomethane | 0.6 g |
| | 9-(2-Methoxyethoxy)methylanthracene | 0.1 g |
| | propylene glycol monomethyl ether acetate | 14.3 g |
| Example 15 | Poly(p-1-ethoxyethoxystyrene/p-hydroxystyrene/p-tert-butoxystyrene) | 5.0 g |
| | Bis(cyclohexylsulfonyl)diazomethane | 0.7 g |
| | 9-(2-Methoxyethoxy)methylanthracene | 0.1 g |
| | propylene glycol monomethyl ether acetate | 14.2 g |
| Example 16 | Poly(p-1-methoxy-1-methylethoxystyrene/p-hydroxystyrene/p-tert-butoxystyrene) | 5.0 g |
| | 1-Diazo-1-methylsulfonyl-4-phenylbutan-2-one | 0.6 g |
| | Dimethylphenylsulfonium trifluoromethanesulfonate [Photoacid generator of Reference Example 14] | 0.1 g |
| | 9-(2-Methoxyethoxy)methyl-anthracene | 0.1 g |
| | Propylene glycol monomethyl ether acetate | 14.4 g |

Using the above resist materials, patterns were formed according to the same process as Example 2. The results are shown in Table 5.

TABLE 5

| | | Time from exposure to heat treatment and resolving performance ($\mu m$ L/S) | | | | |
|---|---|---|---|---|---|---|
| Example | Exposure (mJ/cm$^2$) | Immediately after exposure | 30 min. | 8 hr. | Mask linearity | Storage stability |
| 3 | 18 | 0.22 | 0.22 | 0.22 | Good | Good |
| 4 | 28 | 0.24 | 0.24 | 0.24 | Good | Good |
| 5 | 36 | 0.24 | 0.24 | 0.24 | Good | Good |
| 6 | 18 | 0.24 | 0.24 | 0.24 | Good | Good |
| 7 | 26 | 0.22 | 0.22 | 0.22 | Good | Good |
| 8 | 33 | 0.22 | 0.22 | 0.22 | Good | Good |
| 9 | 35 | 0.24 | 0.24 | 0.24 | Good | Good |
| 10 | 17 | 0.24 | 0.24 | 0.24 | Good | Good |
| 11 | 40 | 0.24 | 0.24 | 0.24 | Good | Good |
| 12 | 33 | 0.22 | 0.22 | 0.22 | Good | Good |
| 13 | 26 | 0.22 | 0.22 | 0.22 | Good | Good |
| 14 | 33 | 0.22 | 0.22 | 0.22 | Good | Good |
| 15 | 35 | 0.22 | 0.22 | 0.22 | Good | Good |
| 16 | 16 | 0.24 | 0.24 | 0.24 | Good | Good |

As is seen from Table 5, in any of Examples 3–16, a positive pattern could be formed as in Example 2, and the 0.22–0.24 $\mu m$ line and space could be resolved normally even after the lapse of 8 hours from exposure in the process from exposure to heat treatment (post-exposure-baking) as in Example 2. Also, a focus margin above ±0.8 $\mu m$ could be obtained for 0.30 $\mu m$ line and space, and good mask linearity was maintained up to 0.25 $\mu m$.

Further, any of the resist materials according to Examples 3–16 showed good storage stability.

Example 17

A photoresist material of the following composition was prepared:

| | |
|---|---|
| Poly(p-1-ethoxyethoxystyrene/p-hydroxystyrene/p-tert-butoxystyrene) | 5.0 g |
| Bis(cyclohexylsulfonyl)diazomethane | 0.3 g |
| 1,2,3-tris(trifluoromethanesulfonyloxy)benzene [Photoacid generator of Synthesis Example 12] | 0.03 g |
| Propylene glycol monomethyl ether acetate | 19.67 g |

Using the above resist material, a pattern was formed in the same manner as described in Example 2. The obtained pattern had a rectangular shape and showed a 0.22 $\mu m$ line and space resolution. Exposure applied in this process was approximately 14 mJ/cm$^2$.

Change of pattern size during the period from exposure till heat treatment (post-exposure-baking) was made. 0.22 $\mu m$ line and space could be resolved in a satisfactory way even after the lapse of 8 hours from exposure.

Also, in case the above resist material was used, good mask linearity was maintained up to 0.25 $\mu m$. In the case of defocus exposure, no deterioration of shape took place till ±0.8 μm for the 0.30 μm line and space, and a sufficient focus margin was obtained.

Figure 3:
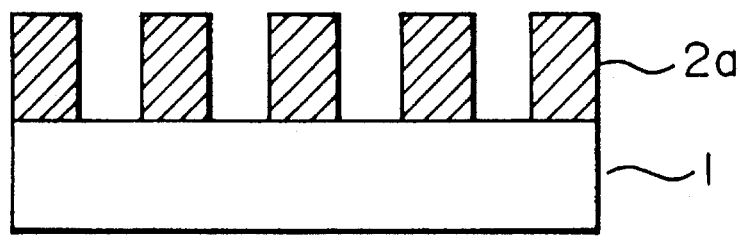
FIG. 3 is a good pattern having no tail or scum at its bottom portion, obtained in Example 17.

The pattern formed by using the above resist material was smooth on its side wall. Also, because of sufficient supply of acid along the full length of resist down to the bottom portion thereof, no tails and scums were observed at the end of the pattern as shown in FIG. 3. Further, when a pattern was formed in the same manner as described above after keeping the resist material in storage at 23° C. for one month, a 0.22 μm line and space positive pattern could be resolved at the same exposure to show good storage stability of the resist material.

Examples 18–29

Photoresist materials of the compositions shown in Tables 6–9 were prepared.

TABLE 6

| | | |
|---|---|---|
| Example 18 | Poly(p-1-ethoxyethoxystyrene/p-hydroxystyrene/p-tert-butoxystyrene) | 5.5 g |
| | Bis(1,1-dimethylethylsulfonyl)diazomethane | 0.3 g |
| | 2,3,4-Tris(trifluoromethanesulfonyloxy)acetophenone [Photoacid generator of Synthesis Example 13] | 0.05 g |
| | Propylene glycol monomethyl ether acetate | 19.17 g |
| Example 19 | Poly(p-1-methoxyethoxystyrene/p-hydroxystyrene/p-tert-butoxystyrene) | 5.0 g |
| | Bis(1,1-dimethylethylsulfonyl)diazomethane | 0.3 g |
| | 2,2',4,4'-tetra(trifluoromethanesulfonyloxy)benzophenone [Photoacid generator of Synthesis Example 14] | 0.05 g |
| | Propylene glycol monomethyl ether acetate | 19.67 g |
| Example 20 | Poly(p-1-methoxy-1-methylethoxystyrene/p-hydroxystyrene/p-tert-butoxystyrene) | 5.0 g |
| | 1-Diazo-methylsulfonyl-4-phenylbutan-2-one | 0.3 g |
| | 1,2,3-Tris(2,2,2-trifluoroethanesulfonyloxy)benzene [Photoacid generator of Synthesis Example 15] | 0.05 g |
| | 9-(2-Methoxyethoxy)methylanthracene | 0.1 g |
| | Propylene glycol monomethyl ether acetate | 14.57 g |

TABLE 7

| | | |
|---|---|---|
| Example 21 | Poly(p-1-ethoxyethoxystyrene/p-hydroxystyrene/p-acetyloxystyrene) [Polymer of Synthesis Example 8] | 5.0 g |
| | Bis(1,1-dimethylethylsulfonyl)diazomethane | 0.3 g |
| | Diphenyl-p-tolylsulfonium perfluorooctane sulfonate [Photoacid generator of Synthesis Example 17] | 0.02 g |
| | Propylene glycol monomethyl ether acetate | 14.68 g |
| Example 22 | Poly(p-1-ethoxyethoxystyrene/p-hydroxystyrene/p-tetrahydropyranyloxystyrene) [Polymer of Synthesis Example 9] | 5.0 g |
| | Bis(1,1-dimethylethylsulfonyl)diazomethane | 0.3 g |
| | 2,3,4-tris(2,5-dichlorobenzenesulfonyloxy)acetophenone [Photoacid generator of Synthesis Example 16] | 0.02 g |

TABLE 7-continued

| | | |
|---|---|---|
| | Ethyl lactate | 14.65 g |
| Example 23 | Poly(p-1-ethoxyethoxystyrene/p-hydroxystyrene/p-tert-butoxycarbonyloxystyrene) [Polymer of Synthesis Example 10] | 5.0 g |
| | Bis(cyclohexylsulfonyl)diazomethane | 0.3 g |
| | Triphenylsulfonium trifluoromethanesulfonate [Commercial product] | 0.02 g |
| | Propylene glycol monomethyl ether acetate | 14.65 g |

TABLE 8

| | | |
|---|---|---|
| Example 24 | Poly(p-1-methoxyethoxystyrene/p-hydroxystyrene/tert-butyl vinylphenoxyacetate [Polymer of Synthesis Example 11] | 5.0 g |
| | Bis(1-methylethylsulfonyl)diazomethane | 0.3 g |
| | 2,3,4-tris(2,5-dichlorobenzenesulfonyloxy)acetophenone | 0.03 g |
| | Propylene glycol monomethyl ether acetate | 14.7 g |
| Example 25 | Poly(p-1-ethoxyethoxystyrene/p-hydroxystyrene/p-tert-butoxystyrene) | 5.0 g |
| | Bis(cyclohexylsulfonyl)diazomethane | 0.3 g |
| | Triphenylsulfonium trifluoromethanesulfonate | 0.03 g |
| | Propylene glycol monomethyl ether acetate | 14.7 g |
| Example 26 | Poly(p-1-ethoxyethoxystyrene/p-hydroxystyrene/p-tert-butoxycarbonyloxystyrene | 5.0 g |
| | Bis(1,1-dimethylethylsulfonyl)diazomethane | 0.3 g |
| | Methylsulfonyl-p-toluenesulfonyldiazomethane | 0.03 g |
| | Ethyl lactate | 14.8 g |

TABLE 9

| | | |
|---|---|---|
| Example 27 | Poly(p-1-ethoxyethoxystyrene/p-hydroxystyrene/p-tert-butoxystyrene) | 5.5 g |
| | 1-Acetyl-1-(1-methylethylsulfonyl)diazomethane | 0.3 g |
| | Diphenyl-p-tolylsulfonium perfluorooctanesulfonate | 0.03 g |
| | Propylene glycol monomethyl ether acetate | 14.2 g |
| Example 28 | Poly(p-1-ethoxyethoxystyrene/p-hydroxystyrene/p-tert-butoxycarbonyloxystyrene) | 5.0 g |
| | Bis(cyclohexylsulfonyl)diazomethane | 0.3 g |
| | Triphenylsulfonium 10-camphorsulfonate [Photoacid generator of Synthesis Example 19] | 0.03 g |
| | Propylene glycol monomethyl ether acetate | 14.4 g |
| Example 29 | Poly(p-1-ethoxyethoxystyrene/p-hydroxystyrene/p-tert-butoxystyrene) | 5.0 g |
| | Bis(1,1-dimethylethylsulfonyl)diazomethane | 0.3 g |
| | Triphenylsulfonium p-toluenesulfonate [Photoacid generator of Synthesis | 0.03 g |

TABLE 9-continued

| Example 18] | |
|---|---|
| Propylene glycol monomethyl ether acetate | 14.4 g |

Using the above resist materials, patterns were formed according to the process of Example 2. Results are shown in Table 10.

TABLE 10

| | | Time from exposure to heat treatment and resolving performance (μm L/S) | | | | |
|---|---|---|---|---|---|---|
| Example | Exposure (mJ/cm$^2$) | Immediately after exposure | 30 min. | 8 hr. | Mask linearity | Storage stability |
| 18 | 18 | 0.22 | 0.22 | 0.22 | Good | Good |
| 19 | 30 | 0.22 | 0.22 | 0.22 | Good | Good |
| 20 | 35 | 0.24 | 0.24 | 0.24 | Good | Good |
| 21 | 30 | 0.24 | 0.24 | 0.24 | Good | Good |
| 22 | 35 | 0.24 | 0.24 | 0.24 | Good | Good |
| 23 | 30 | 0.24 | 0.24 | 0.24 | Good | Good |
| 24 | 30 | 0.24 | 0.24 | 0.24 | Good | Good |
| 25 | 28 | 0.22 | 0.22 | 0.22 | Good | Good |
| 26 | 28 | 0.22 | 0.22 | 0.22 | Good | Good |
| 27 | 33 | 0.22 | 0.22 | 0.22 | Good | Good |
| 28 | 25 | 0.22 | 0.22 | 0.22 | Good | Good |
| 29 | 28 | 0.24 | 0.24 | 0.24 | Good | Good |

As is seen, from Table 10, in any of Examples 18–29, 0.22–0.24 μm line and space could be resolved normally even after the lapse of 8 hours from start of the operation from exposure till heat treatment (post-exposure-baking) as in Example 2. Also, in case the above resist materials were used, good mask linearity was maintained up to 0.25 μm. In the case of defocus exposure, the formed patterns had a smooth side wall. Further, due to sufficient supply of acid down to the bottom portion of resist, there was observed no scum and tails at the bottom portion of pattern. A focus margin greater than ±0.8 μm was obtained for 0.30 μm line and space. Any of the resist materials of Examples 18–29 showed satisfactory storage stability.

Example 30

A photoresist material of the following composition was prepared:

| Poly(p-1-ethoxyethoxystyrene/p-hydroxystyrene/p-tert-butoxystyrene) | 5.0 g |
|---|---|
| Triphenylsulfonium trifluoromethane sulfonate | 0.3 g |
| Propylene glycol monomethyl ether acetat | 14.7 g |

The above resist material was spin coated on a semiconductor substrate and prebaked on a hot plate at 90° C. for 90 seconds to form a 1.0 μm thick film of resist material. On this resist material film was spin coated a coating material of the following composition to form a 0.1–0.15 μm overcoat:

| Polyacrylic acid | 2.0 g |
|---|---|
| Perfluorooctanesulfonic acid | 2.5 g |
| Fluorine-containing nonionic surfcatant | 0.2 g |
| Water | 95.3 g |

Then a pattern was formed in the same way as Example 2. The obtained pattern was of a rectangular shape and had a 0.22 μm line and space resolving power. Exposure dose in the above process was approximately 15 mJ/cm$^2$. Pattern size was measured with the laspe of time during operation from exposure till heat treatment. As it was found, 0.22 μm line and space could be resolved even after the lapse of 8 hours from exposure. Due to additional use of said aqueous overcoating material, mask linearity was maintained good up to 0.25 μm. There was observed no scum and tails at the pattern bottom. The above resist material also showed good storage stability.

Comparative Examples 1–14

By way of comparison, photoresist materials were prepared from the formulations shown in Tables 11–14 and patterns were formed in the same manner as described in Example 2 using the above photoresist materials.
Results are shown in Tables 15–16.

Figure 4:
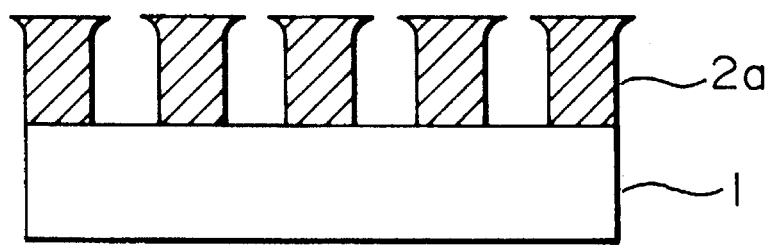
FIG. 4 is a sectional view showing T-shaping of the coating film observed when a positive pattern was formed by using the resist material of Comparative Example 1.
Figure 5:
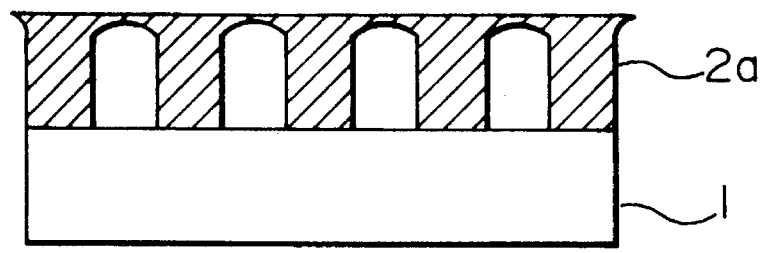
FIG. 5 is a sectional view illustrating failure in forming a pattern as observed when it was tried to form a positive pattern by using the resist materials of Comparative Examples 2–8.

The result (T-shaping) of pattern forming process of Comparative Example 1 where the resist material was heat treated (post-exposure-baked) and developed after the lapse of 30 minutes from exposure is shown in FIG. 4, and the result (failure to form a pattern) of pattern forming processes of Comparative Examples 2 and 3 where heat treatment and development were carried out after the lapse of 30 minutes form exposure, Comparative Examples 4–8 and 10–14 where heat treatment and development were conducted after the lapse of 15 minutes from exposure and Comparative Example 9 where heat treatment and development were conducted after the lapse of 8 hours from exposure, is shown in FIG. 5.

TABLE 11

| Comp. Example 1 | Poly(p-tetrahydropyranyloxystyrene/p-hydroxystyrene) [Polymer of Reference Example 2] | 5.0 g |
|---|---|---|
| | Bis(cyclohexylsulfonyl)diazomethane | 0.3 g |
| | Diethylene glycol dimethyl ether | 14.7 g |
| Comp. Example 2 | Poly(p-tert-butoxystyrene/p-hydroxystyrene) [Polymer of Reference Example 4] | 5.0 g |
| | Bis(cyclohexylsulfonyl)diazomethane | 0.3 g |
| | Diethylene glycol dimethyl ether | 14.7 g |
| Comp. Example 3 | Poly(p-tert-butoxycarbonyloxystyrene/p-hydroxystyrene [Polymer of Reference Example 3] | 5.0 g |
| | Bis(cyclohexylsulfonyl)diazomthane | 0.3 g |
| | Diethylene glycol dimethyl ether | 14.7 g |
| Comp. Example 4 | Poly(p-tert-butoxycarbonyloxysltyrene/p-hydroxystyrene) | 5.0 g |
| | Triphenylsuflonium trifluoromethane-sulfonate [Commercial product] | 0.5 g |
| | Propylene glycol monomethyl ether acetate | 14.5 g |
| Comp. Example 5 | Poly(p-tetrahydropyranyloxystyrene/p-hydroxystyrene) | 5.0 g |
| | Diphenyliodonium hexafluoro-phosphate [Commercial product] | 0.3 g |
| | Diethylene glycol dimethyl ether | 14.7 g |

TABLE 12

| Comp. Example 6 | Poly(p-tert-butoxystyrene/p-hydroxystyrene) | 5.0 g |
|---|---|---|
| | Triphenylsulfonium hexafluorophosphate | 0.3 g |
| | Diethylene glycol dimethyl ether | 14.7 g |
| Comp. Example 7 | Poly(p-tert-butoxyxarbonyloxystryene/p-hydroxystyrene) | 5.0 g |
| | Diphenyliodonium hexafluorophosphate | 0.3 g |
| | Diethylene glycol dimethyl ether | 14.7 g |
| Comp. | Poly(p-1-ethoxyethoxystyrene/p- | 5.0 g |

TABLE 12-continued

| | | |
|---|---|---|
| Example 8 | hydroxystyrene/styrene [Polymer of Synthesis Example 2] | |
| | Tris(trichloromethyl)-s-triazine | 1.1 g |
| | Triethanolamine | 0.1 g |
| | Propylene glycol monomethyl ether acetate | 13.8 g |
| Comp. Example 9 | Poly(tert-butyl p-vinylphenoxyacetate/ p-hydroxystyrene) [Polymer of Reference Example 10] | 5.0 g |
| | Bis(cyclohexylsulfonyl)diazomethane | 0.3 g |
| | Methyl 3-methoxypropionate | 14.7 g |

TABLE 13

| | | |
|---|---|---|
| Comp. Example 10 | Poly(p-1-ethoxyethoxystyrene/p-hydroxystyrene/p-methylstyrene) [Polymer of Synthesis Example 1] | 5.0 g |
| | Diphenyliodonium hexafluorophosphate | 0.3 g |
| | Propylene glycol monomethyl ether acetate | 14.7 g |
| Comp. Example 11 | Poly(p-1-ethoxyethoxystyrene/p-hydroxystyrene/p-acetyloxystyrene [Polymer of Synthesis Example 8] | 5.0 g |
| | Triphenylsulfonium hexafluorophosphate | 0.3 g |
| | Propylene glycol monomethyl ether acetate | 14.7 g |

TABLE 13-continued

| | | |
|---|---|---|
| Comp. Example 12 | Poly(p-1-ethoxyethoxystyrene/p-hydroxystyrene/p-tert-butoxycarbonyloxystyrene) [Polymer of Synthesis Example 10] | 5.0 g |
| | Diphenyliodonium hexafluorophosphate | 0.3 g |
| | Propylene glycol monomethyl ether acetate | 14.7 g |

TABLE 14

| | | |
|---|---|---|
| Comp. Example 13 | Poly(p-1-ethoxyethoxystyrene/p-hydroxystyrene/p-tert-butoxystyrene) | 5.0 g |
| | Tris(trichloromethyl)-s-triazine | 1.2 g |
| | Acetamide | 0.2 g |
| | Propylene glycol monomethyl ether acetate | 13.6 g |
| Comp. Example 14 | Poly(p-1-ethoxyethoxystyrene/p-hydroxystyrene/p-tert-butoxycarbonyloxystyrene) | 5.0 g |
| | 2,6-Dinitrobenzyl p-toluenesulfonate | 0.3 g |
| | Propylene glycol monomethyl ether acetate | 14.8 g |

TABLE 15

| | | Time from exposure to heat treatment and resolving performance (μm L/S) | | | | |
|---|---|---|---|---|---|---|
| Comp. Example | Exposure mJ/cm² | Immediately after exposure | 15 min. | 30 min. | 1 hr. | 8 hr. |
| 1 | 30 | 0.35 | 0.35 | T-shaping | Unable to form pattern | — |
| 2 | 30 | 0.35 | 0.35 | Unable to form pattern | — | Unable to form pattern |
| 3 | 35 | 0.35 | 0.35 | Unable to form pattern | — | — |
| 4 | 12 | 0.35 | Unable to form pattern | Unable to form pattern | — | — |
| 5 | 3 | 0.35 | Unable to form pattern | — | — | — |
| 6 | 3 | 0.35 | Unable to form pattern | — | — | — |
| 7 | 3 | 0.35 | Unable to form pattern | — | — | — |
| 8 | 6 | 0.40 | Unable to form pattern | — | — | — |
| 9 | 32 | 0.35 | 0.35 | 0.35 | 0.35 | Unable to form pattern |

TABLE 16

| | | Time from exposure to heat treatment and resolving performance (μm L/S) | | | | |
|---|---|---|---|---|---|---|
| Comp. Example | Exposure mJ/cm² | Immediately after exposure | 15 min. | 30 min. | 1 hr. | 8 hr. |
| 10 | 5 | 0.30 | Unable to form pattern | — | — | — |
| 11 | 6 | 0.30 | Unable to form pattern | — | — | — |
| 12 | 3 | 0.30 | Unable to form pattern | — | — | — |
| 13 | 4 | 0.30 | Unable to form pattern | — | — | — |

TABLE 16-continued

| | | Time from exposure to heat treatment and resolving performance (μm L/S) | | | | |
|---|---|---|---|---|---|---|
| Comp. Example | Exposure mJ/cm² | Immediately after exposure | 15 min. | 30 min. | 1 hr. | 8 hr. |
| 14 | 7 | 0.35 | Unable to form pattern | — | — | — |

As is seen from Tables 15–16 and FIGS. 4–5, the resist materials prepared according to the above Comparative Examples are all inferior in resolution to the resist materials using the polymers according to the present invention. Also, in case a time of 15–30 minutes or more is required for the process from exposure to heat treatment (post-exposure-baking) as in the case of Comparative Examples 1–6, there takes place "T-shaping" of the pattern or it becomes impossible to form a pattern itself. The resist material of Comparative Example 9 was incapable of forming a pattern when heat treatment was conducted after the lapse of 8 hours from exposure. Further, in the case of the resist material prepared by combining a polymer according to the present invention and tris(trichloromethyl)-s-triazine/hydrogen donor, a known photoacid generator, no pattern can be formed when 15–30 minutes or longer time is required for the process from exposure till heat treatment as seen from the result of Comparative Example 13

In the case of the photoresist materials of Comparative Examples 10–12, when it was tried to form a pattern by following the process of Example 2 after leaving the resist materials at 23° C. for one week, both exposed and non-exposed portions were dissolved in the developing solution and no pattern could be obtained, indicating poor storage stability of these photoresist materials.

Comparative Example 15

A photoresist material of the following composition was prepared:

| | |
|---|---|
| Poly(p-1-ethoxyethoxystyrene/p-hydroxystyrene/p-tert-butoxystyrene | 5.0 g |
| 2-methyl-2-(p-toluenesulfonyl)-propiophenone | 0.3 g |
| Propylene glycol monomethyl ether acetate | 14.7 g |

Figure 6:
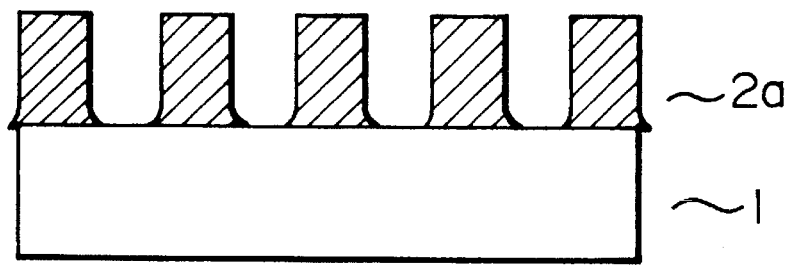
FIG. 6 shows a pattern of improper shape obtained in Comparative Example 15 where tails were seen at the bottom portion of the pattern.
Figure 7:
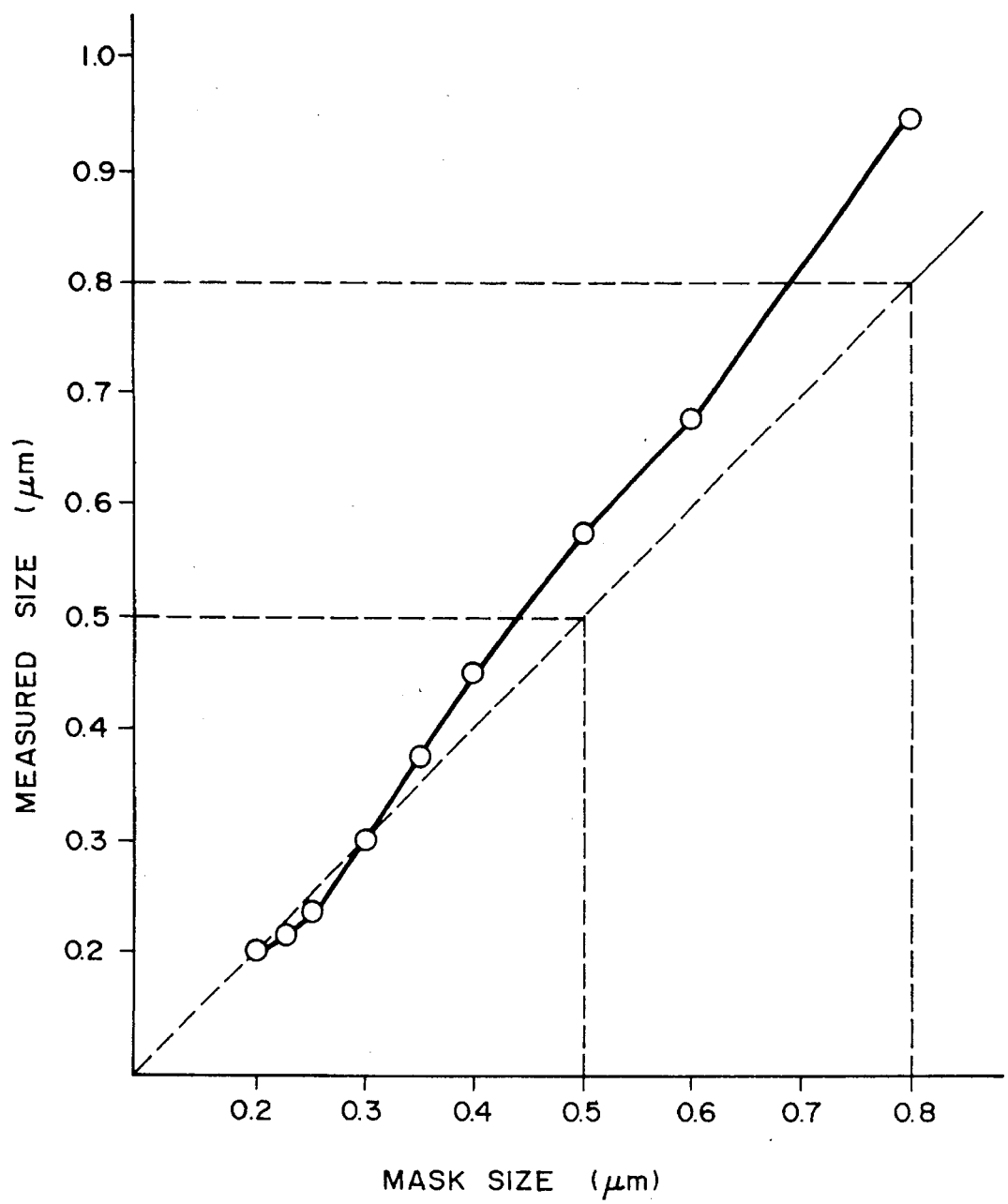
FIG. 7 is an unfavorable mask linearity (mask fidelity) curve of the resist material obtained in Comparative Example 15.

Using the above resist material, pattern formation was carried out according to the process of Example 2. Although a 0.22 μm line and space positive pattern could be formed at exposure of 16 mJ/cm², the bottom portion of the pattern terminated into tails as shown in FIG. 6, making the pattern shape nonconforming. Mask linearity was also poor as shown in FIG. 7. Further, focus margin for 0.30 μm line and space was as small as ±0.6 μm.

Comparative Example 16

A photoresist material of the following composition was prepared:

| | |
|---|---|
| Poly(p-1-ethoxyethoxystyrene/p-hydroxystyrene/fumaronitrile) [Polymer of Reference Example 11] | 5.0 g |
| 2-cyclohexylcarbonyl-2-(p-toluenesulfonyl)propane | 0.3 g |
| Propylene glycol monomethyl ether acetate | 14.7 g |

Using the above resist material, pattern formation was carried out in the same manner as described in Example 2. As a result, a 0.24 μm line and space positive pattern was formed at exposure of 18 mJ/cm² but the focus margin for 0.30 μm line and space and mask linearity were unsatisfactory as in Comparative Example 15.

Comparative Example 17

A photoresist material of the following composition was prepared:

| | |
|---|---|
| Poly(p-1-ethoxyethoxystyrene/p-hydroxystyrlene) [Polymer of Reference Example 1] | 6.0 g |
| Bis(cyclohexylsulfonyl)diazomethane | 0.4 g |
| Diethylene glycol dimethylether | 13.6 g |

Figure 8:
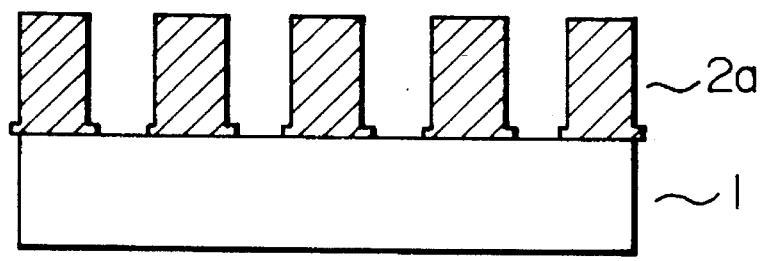
FIG. 8 shows a defective pattern having scums at its bottom portion, obtained in Comparative Example 17.

Using the above resist material, the pattern forming process of Example 2 was carried out. A 0.30 μm line and space positive pattern was formed at exposure of 15 mJ/cm², but scums were observed at the bottom portion of the pattern as shown in FIG. 8. Also, the focus margin for 0.30 μm line and space and mask linearity were unsatisfactory as in Comparative Example 15.

Comparative Example 18

A photoresist material of the following composition was prepared:

| | |
|---|---|
| Poly(p-1-ethoxyethoxystyrene/p-hydroxystyrene) [Polymer of Reference Example 12] | 6.0 g |
| Triphenylsulfonium trifluoromethane-sulfonate | 0.3 g |
| Propylene glycol monomethyl ether acetate | 13.7 g |

Figure 9:
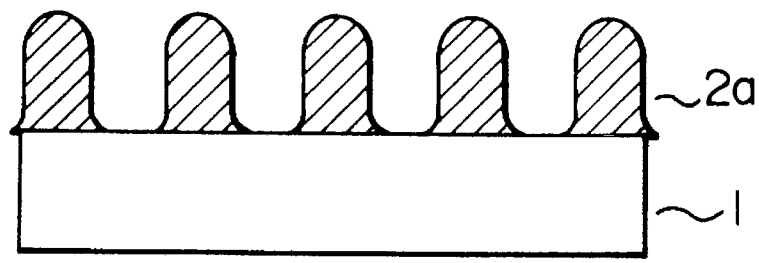
FIG. 9 shows a pattern of improper shape observed in pattern forming according to Comparative Example 18.

Using the above resist material, the process of Example 2 was carried out for forming a pattern. Film exfoliation occurred during development due to imperfect adhesion to the substrate, making it unable to form a pattern. Even if a pattern could be formed, the top of the resist film was rounded and tails were formed at the bottom portion of the pattern as shown in FIG. 9 due to poor heat resistance of said resist material.

Comparative Example 19

A photoresist material of the following composition was prepared:

| | |
|---|---|
| Poly(p-1-ethoxyethoxystyrene/p-hydroxystyrene/p-tert-butoxycarbonyloxystyrene) | 5.0 g |
| N-trifluoromethanesulfonyloxy-bicyclo[2,2,2]-hepto-5-ene-2,3-dicarboxyimide [Photoacid generator of Reference Example 13] | 0.3 g |
| Propylene glycol monomethyl ether acetate | 14.7 g |

Using the above resist material, pattern formation was conducted according to the procedure of Example 2. A 0.30 μm line and space positive pattern was formed at exposure of 9 mJ/cm$^2$. However, when the same pattern forming operation was carried out after 3-day preservation of the resist material at 23° C., although a 0.40 μm line and space positive pattern was formed at exposure of 4 mJ/cm$^2$, the 0.30 μm line and space could not be resolved. Also, a change of sensitivity was observed.

Comparative Example 20

A photoresist material of the following composition was prepared:

| | |
|---|---|
| Poly(p-1-ethoxyethoxystyrene/p-hydroxystyrene) [Polymer of Reference Example 1] | 6.0 g |
| Triphenylsulfonium trifluoromethanesulfonate | 0.3 g |
| Propylene glycol monomethyl ether acetate | 13.7 g |

Using the above resist material, the process of Example 2 was repeated. A 0.30 μm line and space positive pattern was formed at exposure of 6 mJ/cm$^2$, but when heating and development were performed after the lapse of one hour from exposure, the size of the pattern formed was more than 10% smaller than that formed when heating and development were conducted immediately after exposure.

As is appreciated from the foregoing explanation, when a resist material comprising a polymer according to the present invention is used for exposure with a light source of 300 nm or less, such as deep ultraviolet light or KrF excimer laser light (248.4 nm), it is possible to obtain a fine pattern having a very high resolving performance, capable of maintaining its size unchanged throughout the period of operation from exposure till heat treatment (post-exposure-baking) and having a good shape with a practical size of quarter-micron order with a large focal depth tolerance. Mask linearity is also improved. Therefore, the present invention is of great worth for ultra-fine pattern formation in semiconductor industries.

The resist material using a polymer according to the present invention is particularly useful for pattern formation by use of deep ultraviolet light or KrF excimer laser light, but it can also as well be applied to pattern formation using i-line (365 nm), electron beams, soft X-rays or the like.

What is claimed is:

1. A resist material comprising:

(a) a polymer represented by the formula (1):

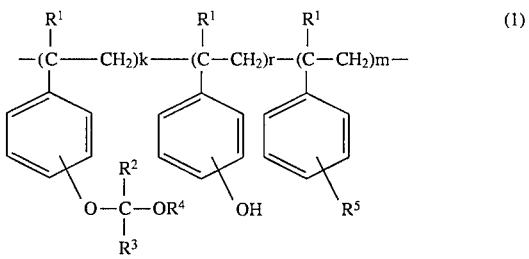

wherein R$^2$ is a hydrogen atom or a methyl group; R$^2$ and R$^3$ are independently a hydrogen atom, a straight-chain, branched or cyclic alkyl group having 1–6 carbon atoms, a straight-chain or branched haloalkyl group having 1–6 carbon atoms, or a phenyl group, provided that R$^2$ and R$^3$ are not hydrogen atom at the same time, or R$^2$ and R$^3$ may combine to form a methylene chain having 2–5 carbon atoms; R$^4$ is a straight-chain, branched or cyclic alkyl group having 1–10 carbon atoms, a straight-chain, branched or cyclic haloalkyl group having 1–6 carbon atoms, an acetyl group or an aralkyl group; R$^5$ is a hydrogen atom, a halogen atom, a straight-chain, branched or cyclic alkyl group having 1–6 carbon atoms, a straight-chain, branched or cyclic alkoxy group having 1–6 carbon atoms, a tetrahydropyranyloxy group, a tetrahydrofuranyloxy group, a tert-butoxycarbonyloxy group, a tert-butoxycarbonylmethoxy group or an acetyloxy group; and k, r and m are independently an integer of 1 or more, provided that $0.10 \leq (k+m)/(k+r+m) \leq 0.90$ and $0.01 \leq m/(k+r+m) \leq 0.25$, (b) at least one photosensitive compound capable of generating an acid upon exposure to light, selected from the group consisting of the photosensitive compounds represented by the following formula (2), the photosensitive compounds represented by the following formula (3), the photosensitive compounds represented by the following formula (4), the photosensitive compounds represented by the following formula (5), the photosensitive compounds represented by the following formula (6) and the photosensitive compounds represented by the following formula (7):

wherein R$^6$ and R$^7$ are independently a straight-chain, branched or cyclic alkyl group having 1–10 carbon atoms or a haloalkyl group having 1–10 carbon atoms; and Z is a sulfonyl group or a carbonyl group;

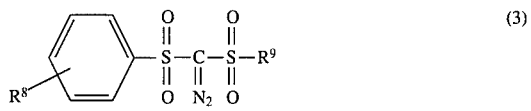

wherein R$^8$ is a hydrogen atom, a halogen atom, a straight-chain or branched alkyl group having 1–5 carbon atoms, a straight-chain or branched alkoxy group having 1–5 carbon atoms, or a straight-chain or branched haloalkyl group having 1–5 carbon atoms; and R$^9$ is a straight-chain, branched or cyclic alkyl group having 1–10 carbon atoms, a haloalkyl group having 1–10 carbon atoms, or a group represented by the formula (a):

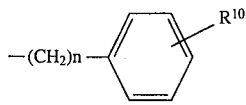  (a)

wherein $R^{10}$ is a hydrogen atom, a halogen atom, a straight-chain or branched alkyl group having 1–5 carbon atoms, a straight-chain or branched alkoxy group having 1–5 carbon atoms, or a straight-chain or branched haloalkyl group having 1–5 carbon atoms; and n is 0 or an integer of 1–3;

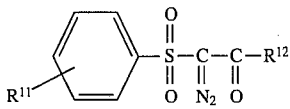  (4)

wherein $R^{11}$ is a hydrogen atom, a halogen atom, a straight-chain or branched alkyl group having 1–5 carbon atoms, an aralkyl group or a trifluoromethyl group; and $R^{12}$ is a straight-chain, branched or cyclic alkyl group having 1–10 carbon atoms, an aralkyl group, a straight-chain or branched alkoxy group having 1–5 carbon atoms, a phenyl group or a tolyl group;

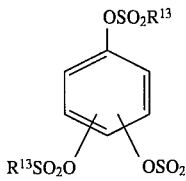  (5)

wherein $R^{13}$ is a group represented by the formula (b):

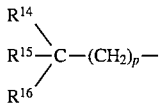  (b)

wherein $R^{14}$, $R^{15}$ and $R^{16}$ are independently a hydrogen atom or a halogen atom; and p is 0 or an integer of 1–3, or a group represented by the formula (c):

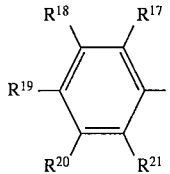  (c)

wherein $R^{17}$ $R^{18}$ $R^{19}$ $R^{20}$ and $R^{21}$ are independently a hydrogen atom, a halogen atom, a straight-chain or branched alkyl group having 1–5 carbon atoms, a straight-chain or branched alkoxy group having 1–5 carbon atoms, a trifluoromethyl group, a hydroxyl group, a trifluoromethoxy group or a nitro group;

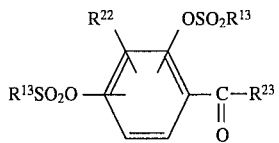  (6)

wherein $R^{13}$ is as defined above; $R^{23}$ is a hydrogen atom, a hydroxyl group or a group represented by the formula (d):

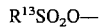  (d)

wherein $R^{13}$ is as defined above; and $R^{23}$ is a straight-chain or branched alkyl group having 1–5 carbon atoms or a group represented by the formula (e):

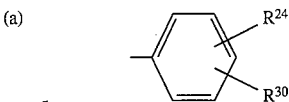  (e)

wherein $R^{24}$ and $R^{30}$ are independently a hydrogen atom, a halogen atom, a straight-chain or branched alkyl group having 1–5 carbon atoms, a straight-chain or branched alkoxy group having 1–5 carbon atoms or a group of the formula (d);

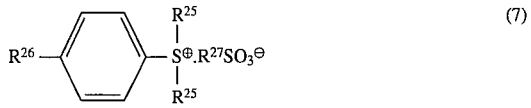  (7)

wherein $R^{25}$ is a straight-chain or branched alkyl group having 1–4 carbon atoms, a phenyl group, a substituted phenyl group or an aralkyl group; $R^{26}$ is a hydrogen atom, a halogen atom or a straight-chain, branched or cyclic alkyl group having 1–6 carbon atoms; $R^{27}$ is a straight-chain or branched perfluoroalkyl group having 1–8 carbon atoms, a straight-chain, branched or cyclic alkyl group having 1–8 carbon atoms, a 1-naphthyl group, a 2-naphthyl group, a 10-camphor group, a phenyl group, a tolyl group, a 2,5-dichlorophenyl group, a 1,3,4-trichlorophenyl group or a trifluoromethylphenyl group; and (c) a solvent capable of dissolving the above components (a) and (b).

2. A resist material according to claim 1 wherein the photosensitive compound capable of generating an acid upon exposure to light is at least one photosensitive compound of the formula (2), or a combination of at least one photosensitive compound of the formula (2) and at least one photosensitive compound selected from the group consisting of the photosensitive compounds of the formulae (3)–(7).

3. A resist material according to claim 1 wherein the photosensitive compound capable of generating an acid upon exposure to light is a combination of at least one photosensitive compound of the formula (2) and at least one photosensitive compound selected from the group consisting of the photosensitive compounds of the formulae (3), (6) and (7).

4. A resist material according to claim 1 which further comprises an ultraviolet absorbent.

5. A resist material according to any of claims 1–4 wherein in the polymer of the formula (1) $R^1$ is a hydrogen atom; $R^2$ is a hydrogen atom or a straight-chain or branched alkyl group having 1–6 carbon atoms; $R^3$ is a straight-chain or branched alkyl group having 1–6 carbon atoms; $R^4$ is a straight-chain or branched alkyl group having 1–10 carbon atoms; and $R^5$ is a hydrogen atom, a straight-chain or branched alkyl group having 1–6 carbon atoms, a straight-chain or branched alkoxy group having 1–6 carbon atoms, a tetrahydropyranyl group, a tert-butoxycarbonyloxy group, a tert-butoxycarbonylmethoxy group or an acetyloxy group.

6. A resist material according to claim 5 wherein in the polymer of the formula (1) $R^1$ is a hydrogen atom; $R^3$ is a hydrogen atom or a methyl group; $R^3$ is a methyl group or an ethyl group; $R^4$ is a straight-chain or branched alkyl group having 1–4 carbon atoms; and $R^5$ is a hydrogen atom, a straight-chain or branched alkyl group having 1–4 carbon atoms, a straight-chain or branched alkoxy group having 1–4 carbon atoms, or an acetyloxy group.

7. A resist material according to claim 1 wherein in the polymer of the formula (1) (k+m)/(k+r+m) is in the range of 0.2–0.7.

* * * * *

UNITED STATES PATENT AND TRADEMARK OFFICE
CERTIFICATE OF CORRECTION

PATENT NO. : 5,558,971

DATED : Sep. 24, 1996

INVENTOR(S) : Urano et al

It is certified that error appears in the above-identified patent and that said Letters Patent is hereby corrected as shown below:

On title page,

Item [75] "Takaai Negishi" should be corrected to --Takaaki Negishi--

Signed and Sealed this

Twenty-fifth Day of March, 1997

*Attest:*

BRUCE LEHMAN

*Attesting Officer*   Commissioner of Patents and Trademarks